United States Patent [19]
Maki

[11] Patent Number: 6,144,077
[45] Date of Patent: Nov. 7, 2000

[54] SEMICONDUCTOR DEVICE COMPRISING A BIPOLAR TRANSISTOR

[75] Inventor: Yukio Maki, Hyogo, Japan

[73] Assignee: Mitsubishi Denki Kabushiki Kaisha, Tokyo, Japan

[21] Appl. No.: 09/059,201

[22] Filed: Apr. 14, 1998

[30] Foreign Application Priority Data

Nov. 25, 1997 [JP] Japan .................................. 9-323501

[51] Int. Cl.[7] .......................... H01L 29/76; H01L 27/01; H01L 29/80
[52] U.S. Cl. .......................... 257/378; 257/370; 257/350; 257/273
[58] Field of Search ....................... 257/370, 373, 257/378, 379, 565, 591, 903, 361, 205, 273, 337, 350; 438/202, 203, 204, 205, 309, 234

[56] References Cited

U.S. PATENT DOCUMENTS

| 3,893,085 | 7/1975 | Hansen ..................................... 257/378 |
| 5,198,692 | 3/1993 | Momose ................................... 257/591 |
| 5,471,419 | 11/1995 | Sankaranarayanan et al. ......... 257/378 |
| 5,483,483 | 1/1996 | Choi et al. ............................. 257/378 |
| 5,583,363 | 12/1996 | Momose et al. ........................ 257/378 |

*Primary Examiner*—Steven H. Loke
*Assistant Examiner*—Hung K. Vu
*Attorney, Agent, or Firm*—McDermott, Will & Emery

[57] ABSTRACT

A semiconductor device is provided in its base region with an emitter region consisting of a p-type first impurity layer having a first impurity concentration peak at a first depth and a p-type second impurity layer having an impurity concentration peak at a second depth, and ohmic contact is provided in the p-type second impurity layer. Due to this structure, the operability of an SRAM memory cell defining an emitter region of a bipolar transistor by a source/drain region of a MOS transistor can be improved.

4 Claims, 36 Drawing Sheets

6,144,077

SEMICONDUCTOR DEVICE COMPRISING A BIPOLAR TRANSISTOR

BACKGROUND OF THE INVENTION

1. Field of the Invention

The present invention relates to a semiconductor device and a method of fabricating the same, and more particularly, it relates to an improvement in the structure of a bipolar transistor employed for an SRAM (static random access memory).

2. Description of the Prior Art

FIG. 68 is a circuit diagram of a conventional SRAM (static random access memory). Referring to FIG. 68, access transistors Q1 and Q2, driver transistors Q3 and Q4 and load resistances Q5 and Q6 form a prescribed flip-flop circuit.

The stability of a conventional SRAM memory cell is now described with reference to FIG. 69. The stability of the conventional SRAM memory cell is set to satisfy the following relation:

In general, a static noise margin is employed as an index indicating the stability of the SRAM memory cell. The SRAM memory cell can stably hold data in proportion to its static noise margin. The static noise margin, which increases in proportion to the β ratio expressed as "current value of driver transistor/current value of access transistor", is generally set to be at least 3.

If a power supply voltage for the conventional SRAM memory cell reduces, however, the current value of its driver transistor reduces in excess of that of the access transistor to reduce the β ratio even if the stability is attained as described above, since the threshold value $V_{th}$ of the driver transistor is higher than that of the access transistor. Consequently, the static noise margin disappears when the power supply voltage is 2.0 V, for example, to disable the SRAM memory cell for its operation.

SUMMARY OF THE INVENTION

An object of the present invention is to provide a semiconductor device which can stabilize data holding in its memory cell even if a power supply voltage reduces, and a method of fabricating the same.

A semiconductor device according to an aspect of the present invention comprises a first conductivity type semiconductor substrate, a second conductivity type collector region formed up to a position of a first depth from a major surface of the semiconductor substrate, a first conductivity type base region formed up to a position of a second depth, smaller than the first depth, from the major surface of the semiconductor substrate, and an emitter region provided with a first impurity layer having a second conductivity type impurity concentration peak on a position of a third depth, smaller than the second depth, from the major surface of the semiconductor substrate and a second impurity layer, having a second conductivity type impurity concentration peak on a position between the second and third depths, formed to be enclosed with the first impurity layer.

When the semiconductor device having the aforementioned structure is applied to a bipolar transistor employed in an SRAM memory cell, for example, it is possible to form the bipolar transistor through a source/drain region of a MOS transistor.

Consequently, the bipolar transistor can be provided between an access transistor formed by the MOS transistor and a bit line so that a current flowing through the access transistor serves as a base current of the bipolar transistor and reduces to $1/h_{FE}+1$ ($h_{FE}$: current amplification factor) as compared with that of the prior art, whereby a high β ratio can be attained even if a power supply voltage is reduced. Consequently, a static noise margin can be ensured for stabilizing data holding.

Further, the emitter region is provided with the first and second impurity layers having the second conductivity impurity concentration peaks to have a high impurity concentration, whereby an excellent ohmic junction can be formed when the emitter region is to be connected with a metal wiring layer for serving as a bit line, for example, and the operability of the SRAM memory cell can be stabilized.

In the aforementioned semiconductor device, the base region is preferably formed by a source/drain region of a MOS transistor.

In the aforementioned semiconductor device, the first impurity layer is more preferably formed on the major surface of the semiconductor substrate in a region enclosed with an element isolation film and a gate electrode forming the MOS transistor.

Thus, the first impurity layer which is provided in the region enclosed with the element isolation film and the gate electrode can be formed in a self-alignment manner through the gate electrode and the element isolation film serving as masks in a fabrication step therefor, whereby the fabrication process can be simplified and the cell area can be prevented from increase resulting from mask displacement or the like.

In the aforementioned semiconductor device, the first impurity layer is preferably formed not to be in contact with the element isolation film.

When the first impurity layer is formed not to be in contact with the element isolation film, it is possible to prevent punch-through between the collector region and the first impurity layer caused on an edge portion of the element isolation film, thereby preventing reduction of voltage resistance on the edge portion of the element isolation film.

The aforementioned semiconductor device is more preferably provided with a first conductivity type intrinsic base region which is in contact with the second impurity layer and so formed as to extend in the depth direction for reaching the collector region.

Due to such provision of the first conductivity type intrinsic base region, dispersion of the bipolar transistor property of the semiconductor device can be reduced for improving the performance of a low-voltage SRAM memory cell.

A semiconductor device according to another aspect of the present invention comprises a first conductivity type semiconductor substrate, a collector region consisting of a second conductivity type low-concentration impurity region formed up to a position of a first depth from a major surface of the semiconductor substrate, a first conductivity type base region formed up to a position of a second depth, smaller than the first depth, from the major surface of the semiconductor substrate, and an emitter region, consisting of a second conductivity type high-concentration impurity region, formed up to a position of a third depth, smaller than the second depth, from the major surface of the semiconductor substrate.

When the semiconductor device having the aforementioned structure is applied to a bipolar transistor employed in an SRAM memory cell, for example, it is possible to form the bipolar transistor through a source/drain region of a MOS transistor.

Consequently, the bipolar transistor can be provided between an access transistor formed by the MOS transistor and a bit line so that a current flowing through the access transistor serves as a base current of the bipolar transistor and reduces to $1/h_{FE}+1$ ($h_{FE}$: current amplification factor) as compared with that in the prior art, whereby a high β ratio can be attained even if a power supply voltage reduces. Consequently, a static noise margin can be ensured for stabilizing data holding.

Further, the emitter region is formed by the high-concentration impurity region, whereby excellent ohmic contact can be formed when the emitter region is to be connected with a metal wiring layer, for example, for improving reliability in operation of the semiconductor device.

In the aforementioned semiconductor device, the base region is preferably formed by a source/drain region of a MOS transistor.

In the aforementioned semiconductor device, the emitter region is more preferably formed on the major surface of the semiconductor substrate in a region enclosed with an element isolation film and a gate electrode forming the MOS transistor.

Thus, the emitter which is provided in the region enclosed with the element isolation film and the gate electrode can be formed in a self-alignment manner through the gate electrode and the element isolation film serving as masks in a fabrication step therefor, whereby the fabrication process can be simplified and the cell area can be prevented from increase resulting from mask displacement or the like.

In the aforementioned semiconductor device, the emitter region is preferably formed not to be in contact with the element isolation film.

When the emitter region is formed not to be in contact with the element isolation film, it is possible to prevent punch-through between the collector region and the emitter region caused on an edge portion of the element isolation film, thereby preventing reduction of voltage resistance on the edge portion of the element isolation film.

A method of fabricating a semiconductor device according to an aspect of the present invention comprises the following steps:

A second conductivity type impurity is introduced into a first conductivity type semiconductor substrate up to a first depth from its major surface, for forming a collector region. Thereafter an element isolation film is formed on the major surface of the semiconductor substrate, for defining an active region.

Then, a gate electrode is formed on the major surface of the active region of the semiconductor substrate through an insulating film. Thereafter a first conductivity type impurity is introduced up to a second depth, smaller than the first depth, through the element isolation film and the gate electrode serving as masks, for forming a base region.

Then, a resist film is formed to cover the semiconductor substrate while exposing the base region. Thereafter a second conductivity type impurity is introduced into the base region through the resist film serving as a mask to have an impurity concentration peak at a third depth, smaller than the second depth, for forming a first impurity layer.

Then, the resist film is removed, and thereafter an interlayer isolation film covering the semiconductor substrate is formed to partially expose the first impurity layer. Thereafter a second conductivity type impurity is introduced through the interlayer isolation film serving as a mask to have an impurity concentration peak at a depth, reaching the base region, larger than the third depth and smaller than the second depth, for forming a second impurity layer.

Due to the aforementioned steps, it is possible to form an emitter region having the first and second impurity layers. Consequently, it is possible to form a bipolar transistor through a source/drain region of a MOS transistor in case of applying the semiconductor device to a bipolar transistor employed in an SRAM memory cell, for example.

Further, the bipolar transistor can be provided between an access transistor formed by the MOS transistor and a bit line so that a current flowing through the access transistor serves as a base current of the bipolar transistor and reduces to $1/h_{FE}+1$ ($h_{FE}$: current amplification factor) as compared with that of the prior art, whereby a high β ratio can be attained even if a power supply voltage reduces. Consequently, a static noise margin can be ensured for stabilizing data holding.

Further, the emitter region is provided with the first and second impurity layers having the second conductivity impurity concentration peaks to have a high impurity concentration, whereby an excellent ohmic junction can be formed when the emitter region is to be connected with a metal wiring layer for serving as a bit line, for example, and the operability of the SRAM memory cell can be stabilized.

In the aforementioned method of fabricating a semiconductor device, the resist film is preferably formed to also cover a part of the base region which is in contact with the element isolation film in the step of forming the resist film, for forming the first impurity layer not to be in contact with the element isolation film.

Thus, it is possible to implement such a structure that the first impurity layer is not in contact with the element isolation film. When the first impurity layer is formed not to be in contact with the element isolation film, it is possible to prevent punch-through between the collector region and the first impurity layer caused on an edge portion of the element isolation film, thereby preventing reduction of voltage resistance on the edge portion of the element isolation film.

In the aforementioned method of fabricating a semiconductor device, the step of forming the second impurity layer more preferably includes a step of introducing a first conductivity type impurity through the interlayer isolation film serving as a mask for forming a first conductivity type intrinsic base region.

Due to such provision of the first conductivity type intrinsic base region, dispersion of the bipolar transistor property of the semiconductor device can be reduced for improving the performance of a low-voltage SRAM memory cell.

A method of fabricating a semiconductor device according to another aspect of the present invention comprises the following steps:

A second conductivity type impurity is introduced into a first conductivity type semiconductor substrate up to a first depth from its major surface, for forming a collector region consisting of a low-concentration impurity region. Thereafter an element isolation film is formed for defining an active region on the major surface of the semiconductor substrate.

Then, a gate electrode is formed on the major surface of the active region of the semiconductor substrate through an insulating film. Thereafter a first conductivity type impurity is introduced through the element isolation film and the gate electrode serving as masks up to a second depth smaller than the first depth, for forming a base region.

Then, a first resist film covering the semiconductor substrate is formed to expose the base region. Thereafter a second conductivity type impurity is introduced into the base region through the first resist film serving as a mask up to a third depth, smaller than the second depth, for forming an emitter region consisting of a high-concentration impurity region.

When the semiconductor device having the aforementioned structure is applied to a bipolar transistor employed in an SRAM memory cell, for example, it is possible to form the bipolar transistor through a source/drain region of a MOS transistor.

Consequently, the bipolar transistor can be provided between an access transistor formed by the MOS transistor and a bit line so that a current flowing through the access transistor serves as a base current of the bipolar transistor and reduces to $1/h_{FE}+1$ ($h_{FE}$: current amplification factor) as compared with that of the prior art, whereby a high β ratio can be attained even if a power supply voltage reduces. Consequently, a static noise margin can be ensured for stabilizing data holding.

Further, the emitter region is formed by the high-concentration impurity region, whereby excellent ohmic contact can be formed when the emitter region is to be provided with a metal wiring layer, for example, for improving reliability in operation of the semiconductor device.

In the aforementioned method of fabricating a semiconductor device, the first resist film is preferably formed to also cover a part of the base region which is in contact with the element isolation film in the step of forming the first resist film, so that the emitter region is not in contact with the element isolation film.

When the emitter region is formed not to be in contact with the element isolation film, it is possible to prevent punch-through between the collector region and the emitter region caused on an edge portion of the element isolation film, thereby preventing reduction of voltage resistance on the edge portion of the element isolation film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the semiconductor device and the method of fabricating the same according to the present invention are now described with reference to the drawings.

Embodiment 1

Figure 1:
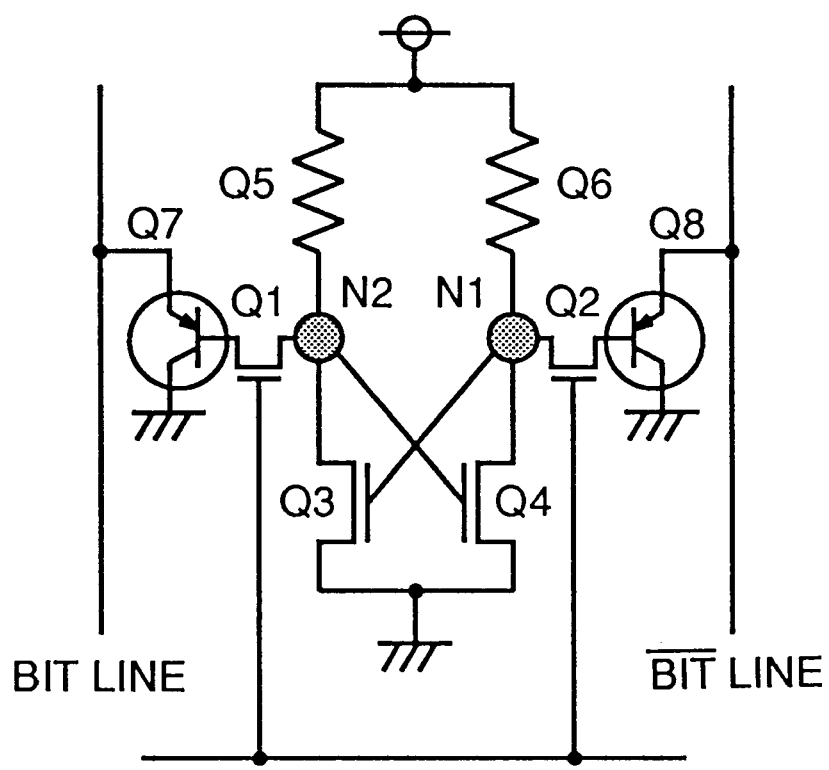
FIG. 1 is a circuit diagram of an SRAM memory cell according to an embodiment 1.

FIG. 1 is a circuit diagram of an SRAM memory cell according to an embodiment 1 of the present invention. Access transistors Q1 and Q2, driver transistors Q3 and Q4 and load resistances Q5 and Q6 form a prescribed flip-flop circuit. In the SRAM memory cell according to this embodiment, bipolar transistors Q7 and Q8 are provided between the access transistors Q1 and Q2 and bit lines, in order to prevent reduction of the β ratio and unstabilization of data holding in the SRAM memory cell following reduction of a power supply voltage.

Figure 2:
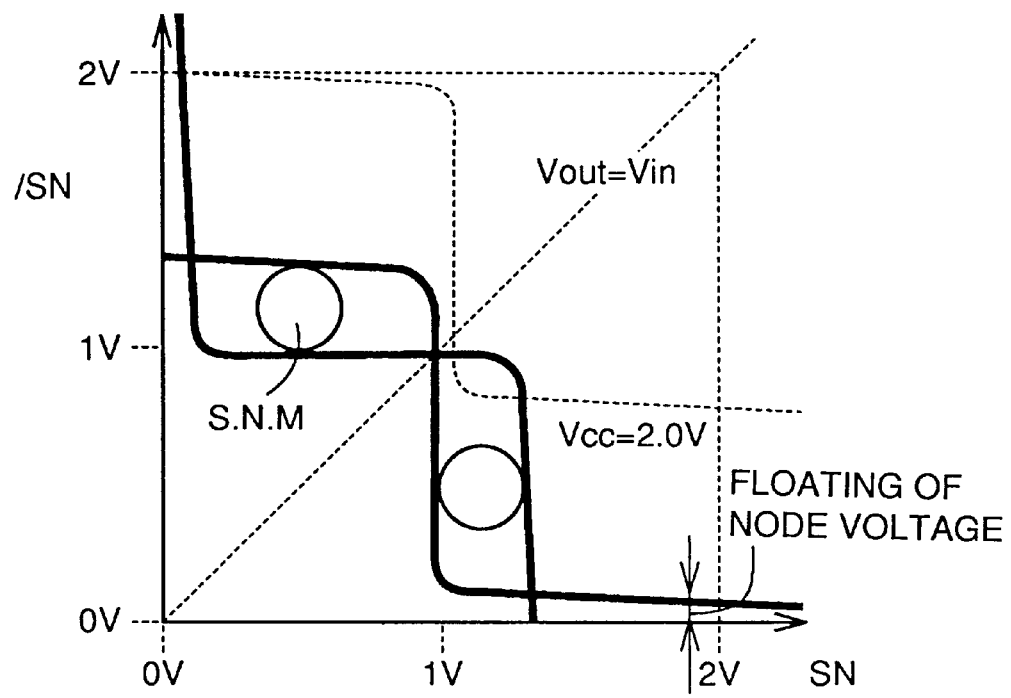
FIG. 2 is adapted to illustrate the function/effect of the SRAM memory cell shown in FIG. 1.

The stability of the SRAM memory cell shown in FIG. 1 is now described with reference to FIG. 2.

Referring to FIG. 1, a current flowing through each bit line and that flowing to the memory cell form an emitter current and a base current of each bipolar transistor, due to the addition of the bipolar transistors Q7 and Q8. While [(current flowing through bit line)=(current of access transistor)=(current flowing to memory cell)] in a general SRAM memory cell, therefore, [(current flowing through bit line)=($h_{FE}$+1) (current flowing to memory cell)] in the SRAM memory cell shown in FIG. 1. This is equivalent to such a state that the current of each access transistor increases to $1/(h_{FE}+1)$ times. Thus, the β ratio (=current value of driver transistor/current value of access transistor) increases to $1/(h_{FE}+1)$ times that of the conventional SRAM memory cell and the current flowing through the memory cell also increases to $1/(h_{FE}+1)$ times, whereby floating of a node potential on a data "0" side also increases to $1/(h_{FE}+1)$ times. Therefore, a large static noise margin can be attained with a low voltage of 2.0 V, for example, for stably holding data, as shown in FIG. 2.

The structure of an SRAM memory for implementing the circuit shown in FIG. 1 is now described with reference to FIG. 3.

Figure 3:
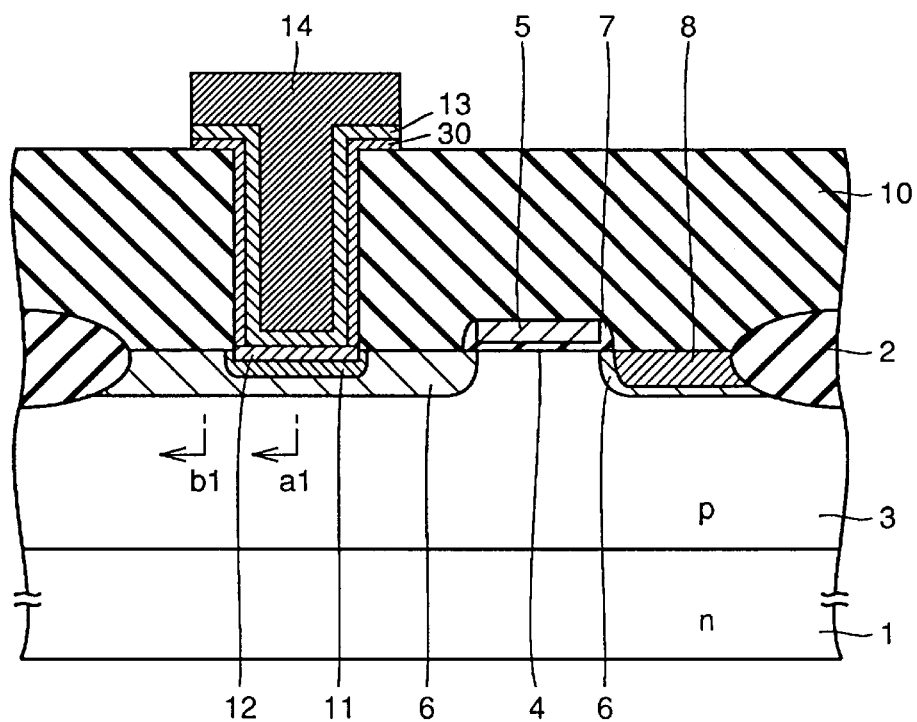
FIG. 3 is a sectional view showing the structure of the SRAM memory cell according to the embodiment 1.

FIG. 3 is a sectional view showing an SRAM memory having a pnp bipolar transistor formed in an n-type MOS transistor.

In the semiconductor device shown in FIG. 3, a p-type well and collector region 3 having an impurity concentration of $1\times10^{16}$ to $5\times10^{17}$ cm$^{-3}$ is formed up to a position of a prescribed depth from a major surface of an n-type semiconductor substrate 1 consisting of silicon or the like, and isolation oxide films 2 for defining an active region are formed on the major surface of the n-type semiconductor substrate 1.

In the active region, a gate electrode 5 is formed on the major surface of the n-type semiconductor substrate 1 through a gate oxide film 4, and side wall oxide films 7 are formed on side wall portions of the gate electrode 5.

The p-type well and collector region 3 is provided with n-type source/drain regions 6 and 8 having impurity concentrations of $5\times10^{17}$ to $1\times10^{19}$ cm$^{-3}$ and $1\times10^{20}$ to $1\times10^{22}$ cm$^{-3}$ respectively, to hold the gate electrode 5 therebetween.

One of the source/drain regions 6 serves also as a base region 6 of a bipolar transistor. A p-type emitter region 11 having an impurity concentration of $5\times10^{19}$ to $1\times10^{21}$ cm$^{-3}$ is formed in this base region 6.

An interlayer isolation film 10 having a contact hole reaching the p-type emitter region 11 is formed on the surface of the n-type semiconductor substrate 1.

The p-type emitter region 11 is connected with a wiring layer 14 consisting of a metal such as Al through the contact hole with interposition of a TiSi film 12, a Ti film 30 and a TiN film 13, to form ohmic contact. The TiN film 13 is adapted to prevent the wiring layer 14 consisting of a metal from punch-through to the p-type emitter region 11.

Figure 4:
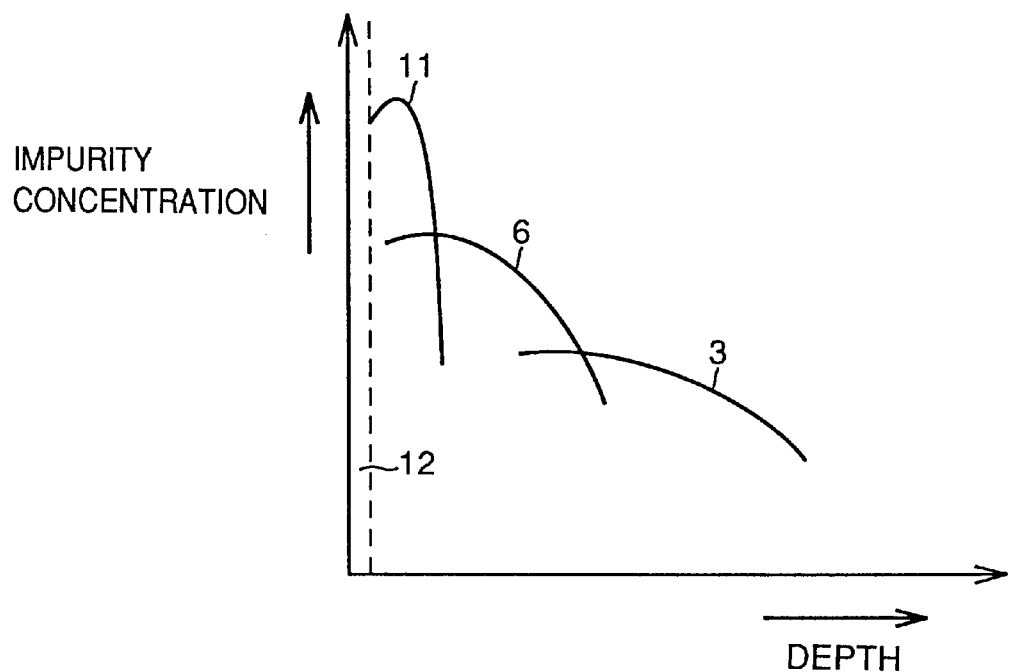
FIG. 4 illustrates an impurity concentration profile along arrow a1 in FIG. 3.
Figure 5:
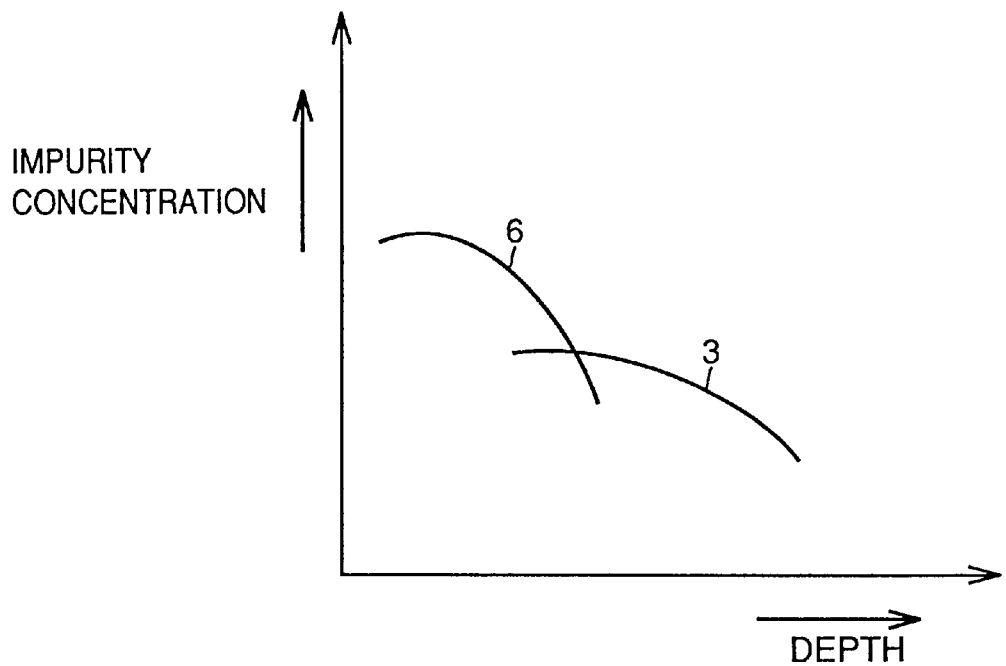
FIG. 5 illustrates an impurity concentration profile along arrow b1 in FIG. 3.

FIGS. 4 and 5 illustrate impurity concentration profiles along arrows a1 and b1 in FIG. 3 respectively.

In the impurity concentration profile shown in FIG. 4, the major surface of the n-type semiconductor substrate 1 consisting of silicon reacts with Ti due to the ohmic contact to form the TiSi film 12 as to the p-type emitter region 11, whereby no impurity is present in this region.

A method of fabricating the semiconductor device shown in FIG. 3 is now described with reference to FIGS. 6 to 12.

Figure 6:
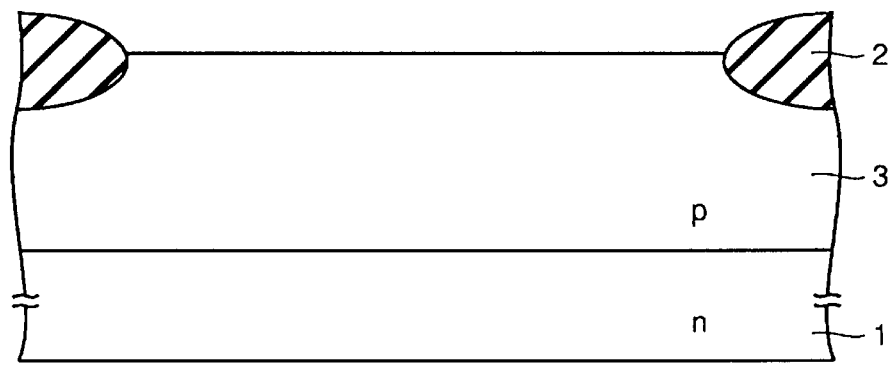
FIGS. 6 to 12 are sectional views showing first to seventh steps of a method of fabricating the SRAM memory cell shown in FIG. 3 respectively.

Referring to FIG. 6, a p-type impurity such as $BF_2$ or B is introduced into the n-type semiconductor substrate 1 up to a position of a prescribed depth from its major surface, for forming the p-type well and collector region 3 having the impurity concentration of $1\times10^{16}$ to $5\times10^{17}$ cm$^{-3}$. Thereafter the isolation oxide films 2 are formed on the major surface of the n-type semiconductor substrate 1 by the LOCOS method or the like, for defining the active region.

Figure 7:
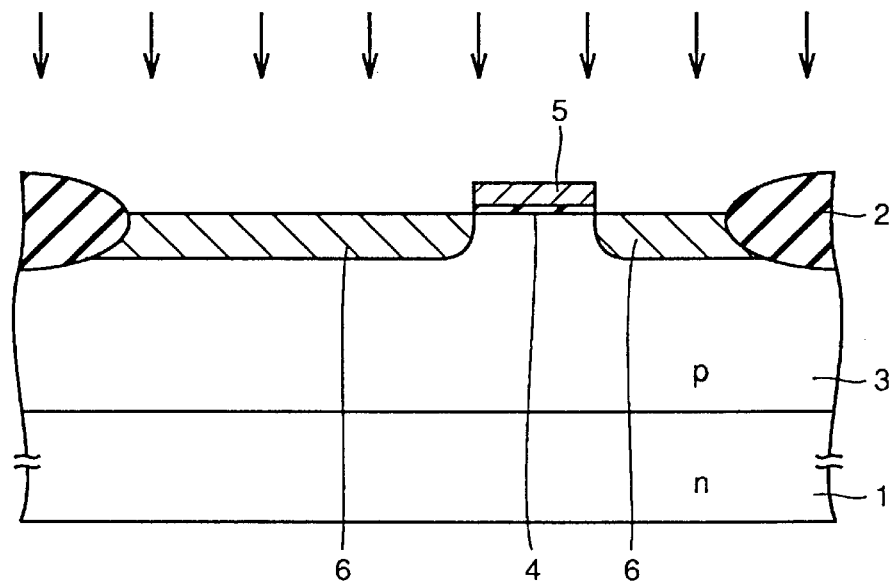

Referring to FIG. 7, the gate electrode 5 is formed on the major surface of the n-type semiconductor substrate 1 through the gate oxide film 4, and thereafter an n-type impurity such as P or As is introduced by $1\times10^{13}$ to $1\times10^{14}$ cm$^{-2}$ through the gate electrode 5 and the isolation oxide films 2 serving as masks, for forming the n-type source/drain regions/base region 6 having the impurity concentration of $5\times10^{17}$ to $5\times10^{19}$ cm$^{-3}$.

Figure 8:
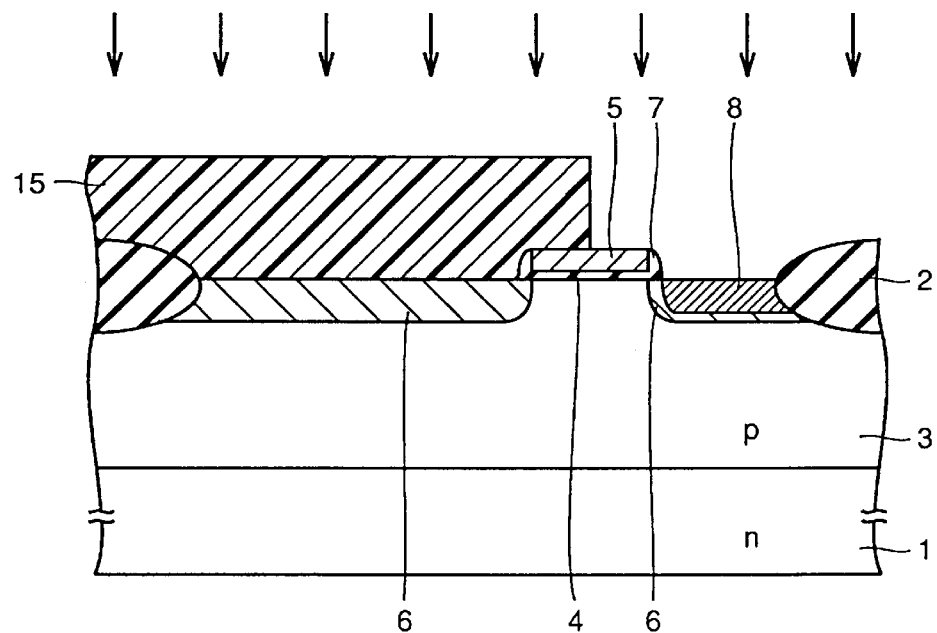

Referring to FIG. 8, the side wall oxide films 7 are formed on the side wall portions of the gate electrode 5, thereafter the base region 6 is covered with a resist film 15, and thereafter an n-type impurity such as As is introduced into the remaining source/drain region 6 by $1\times10^{15}$ to $5\times10^{15}$ cm$^{-2}$, for forming the n-type source/drain region 8 having the impurity concentration of $1\times10^{20}$ to $1\times10^{22}$ cm$^{-3}$.

Figure 9:
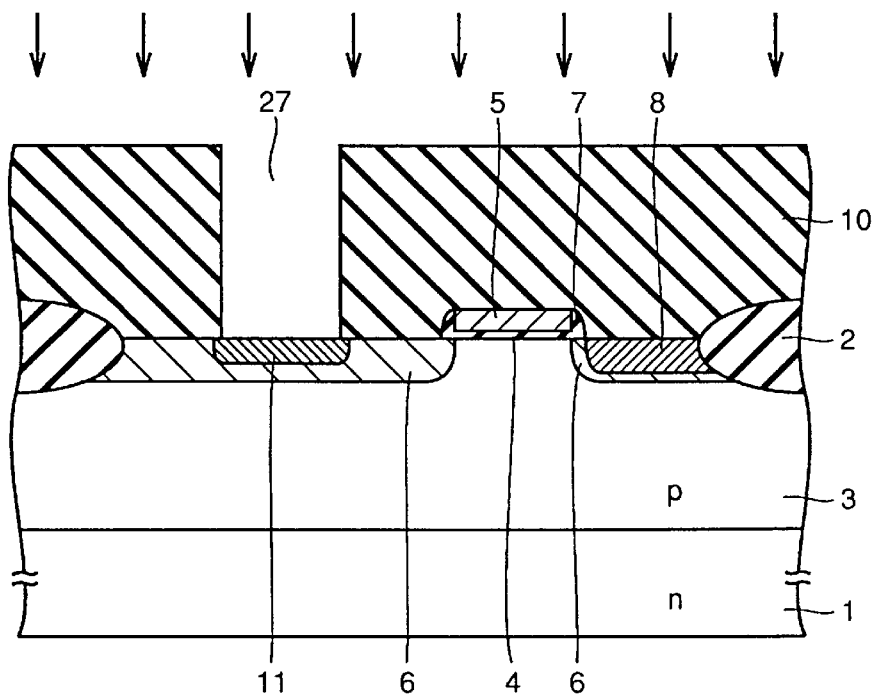

Referring to FIG. 9, the interlayer isolation film 10 is formed on the n-type semiconductor substrate 1, and a contact hole 27 is formed to partially expose the n-type base region 6. Thereafter a p-type impurity such as $BF_2$ or B is introduced by $5\times10^{14}$ to $5\times10$ cm$^{-2}$ through the interlayer isolation film 10 serving as a mask, for forming the p-type emitter region 11 having the impurity concentration of $5\times10^{19}$ to $1\times10^{22}$ cm$^{-3}$.

Figure 10:
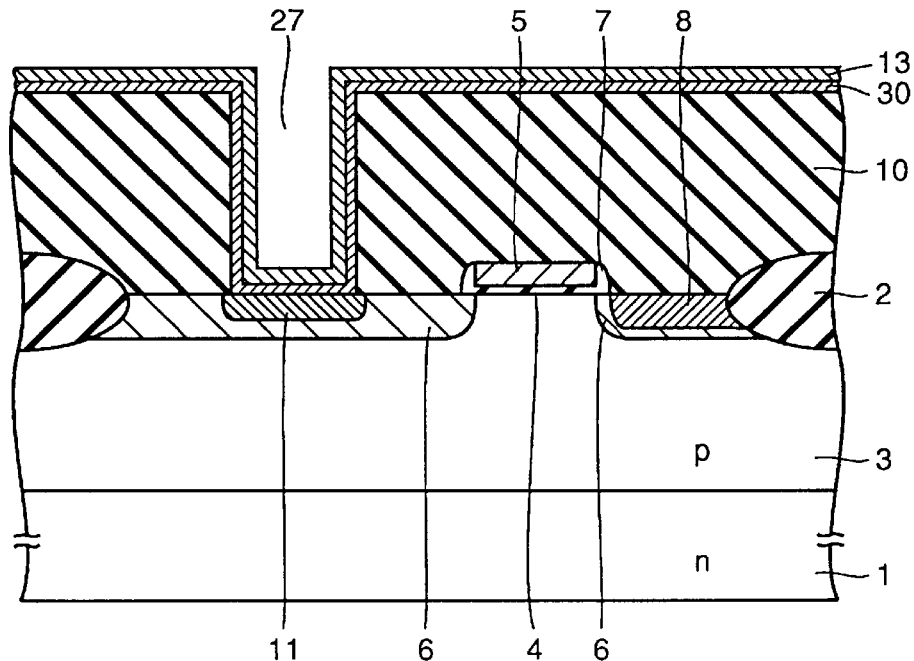
Figure 11:
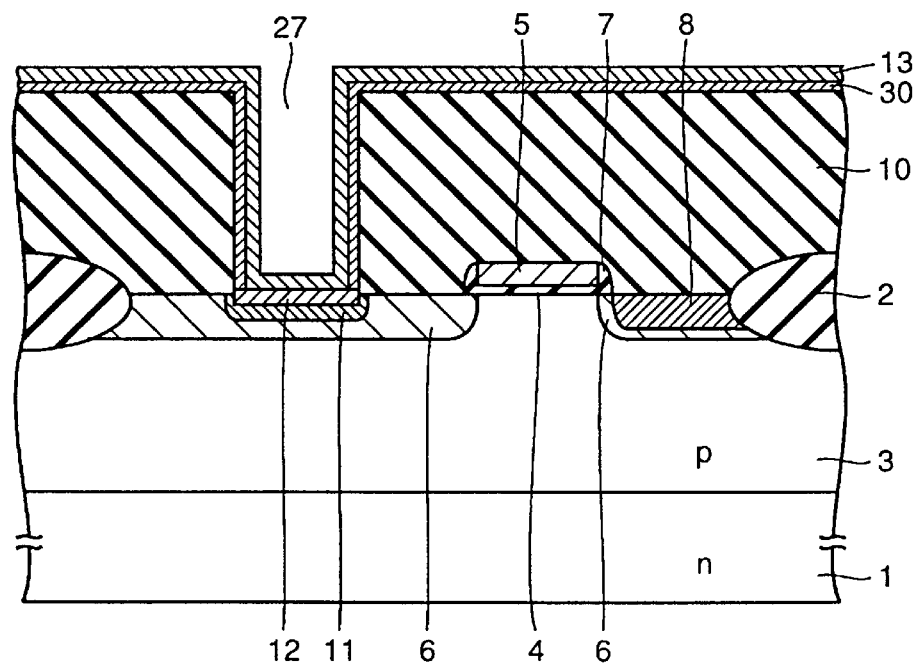

Referring to FIG. 10, the Ti film of 100 to 500 Å and the TiN film 13 of 500 to 2000 Å are formed by sputtering. Thereafter heat treatment is performed to form the TiSi film 12 on the interface between the n-type base region 6 and the Ti film 30, as shown in FIG. 11.

Figure 12:
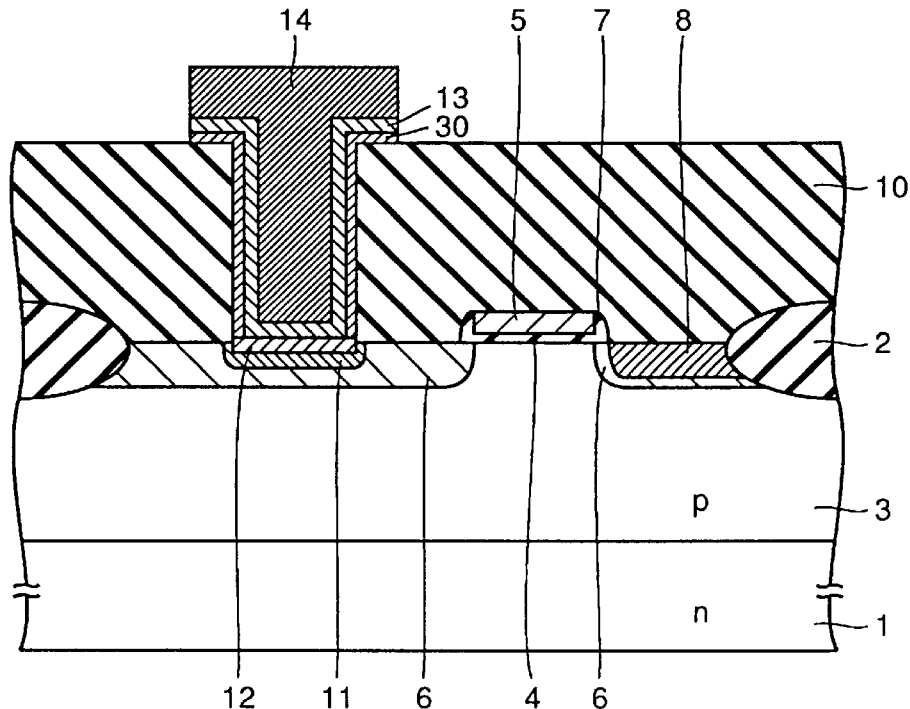

Referring to FIG. 12, the wiring layer 14 consisting of a metal such as Al is deposited in the contact hole 27, and thereafter the wiring layer 14, the TiN film 13 and the Ti film 30 are patterned. Thus, the semiconductor device shown in FIG. 2 is completed.

In the semiconductor device and the method of fabricating the same according to this embodiment, it is possible to provide the SRAM memory cell having stable operability with a low voltage described with reference to FIGS. 1 and 2 without increasing its area by defining the emitter region of the bipolar transistor by one of the source/drain regions of the MOS transistor of the SRAM memory cell.

Embodiment 2

As hereinabove described, the p-type emitter region 11 must be formed in the n-type base region 6 in the semiconductor device according to the embodiment 1. The TiSi film 12 illustrated in FIG. 11 reacts at a ratio of about Ti:Si≈1:2.

When the Ti film 30 is sputtered by 100 Å, therefore, the n-type semiconductor substrate 1 reacts by 200 Å, and the p-type impurity contained in this portion of the p-type emitter region 11 is introduced into the TiSi film 12.

Consequently, it is difficult to actually form an impurity region having the impurity concentration of $5 \times 10^{19}$ to $1 \times 10^{22}$ cm$^{-3}$ as the p-type emitter region 11 even if the p-type impurity such as BF$_2$ is introduced by $5 \times 10^{14}$ to $5 \times 10^{15}$ cm$^{-2}$ as described above. Thus, no high-concentration impurity region for forming excellent emitter connection can be formed but the contact between the wiring layer 14 and the p-type emitter region 11 disadvantageously forms a Schottky junction.

Figure 13:
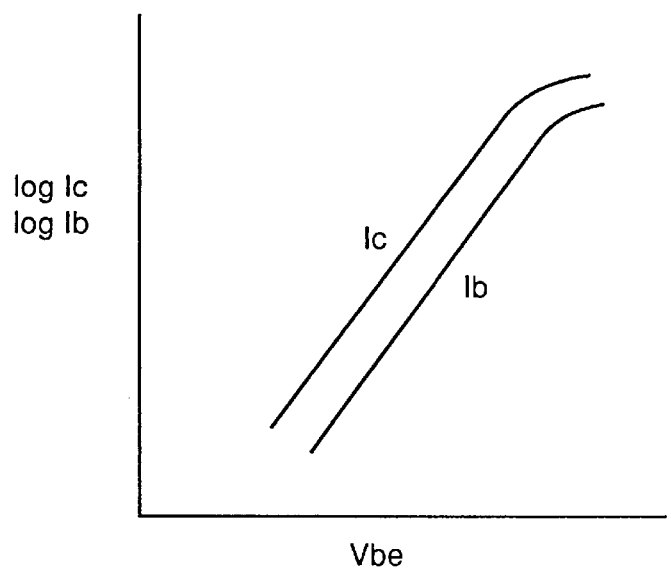
FIGS. 13 and 14 are first and second diagrams for illustrating a problem of the SRAM memory cell according to the embodiment 1.
Figure 14:
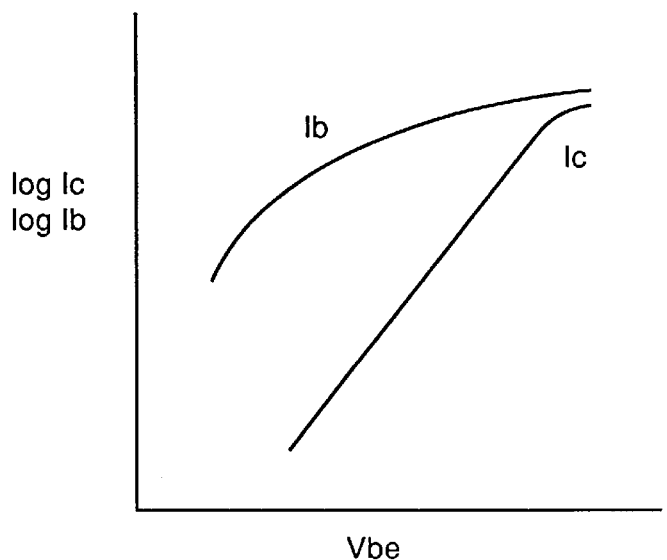

Consequently, the base current of the bipolar transistor according to the embodiment 1 remarkably increases as shown in FIG. 14 as compared with the normal base current of a conventional bipolar transistor shown in FIG. 13, and the current amplification factor (h$_{FE}$) of the bipolar transistor reduces below 1.

In case of increasing the injection rate or the injection energy for the impurity for simply increasing the impurity concentration of the p-type emitter region 11, it is necessary to also increase the injection rate or the injection energy for the impurity for the base region 6. Thus, it is difficult to form the base region of the bipolar transistor by either source/drain region of the MOS transistor.

Accordingly, an embodiment 2 of the present invention is adapted to solve the aforementioned problems of the embodiment 1.

The structure of a semiconductor device according to this embodiment is now described with reference to FIG. 15.

A p-type well and collector region 3 having an impurity concentration of $1 \times 10^{16}$ to $5 \times 10^{17}$ cm$^{-3}$ is formed up to a position of a prescribed depth from a major surface of an n-type semiconductor substrate 1 consisting of silicon or the like, and isolation oxide films 2 for defining an active region are formed on the major surface of the n-type semiconductor substrate 1.

In the active region, a gate electrode 5 is formed on the major surface of the n-type semiconductor substrate 1 through a gate oxide film 4, and side wall oxide films 7 are formed on side wall portions of the gate electrode 5.

The p-type well and collector region 3 is provided with n-type source/drain regions 6 and 8 having impurity concentrations of $5 \times 10^{17}$ to $5 \times 10^{19}$ cm$^{-3}$ and $1 \times 10^{20}$ to $1 \times 10^{22}$ cm$^{-3}$ respectively, to hold the gate electrode 5 therebetween.

One of the source/drain regions 6 serves also as a base region 6 of a bipolar transistor, and a p-type first impurity layer 9a having an impurity concentration of $5 \times 10^{17}$ to $1 \times 10^{20}$ cm$^{-3}$ is formed in this base region 6.

Further, a p-type second impurity layer 9b having an impurity concentration of $5 \times 10^{19}$ to $1 \times 10^{21}$ cm$^{-3}$ is formed in the p-type first impurity layer 9b to be enclosed with this p-type first impurity layer 9a. The p-type first and second impurity layers 9a and 9b form an emitter region 9 of the bipolar transistor.

In addition, an interlayer isolation film 10 having a contact hole reaching the p-type second impurity layer 9b is formed on the surface of the n-type semiconductor substrate 1.

The p-type second impurity layer 9b is connected with a wiring layer 14 consisting of a metal such as Al through the contact hole with interposition of a TiSi film 12, a Ti film 30 and a TiN film 13.

Figure 15:
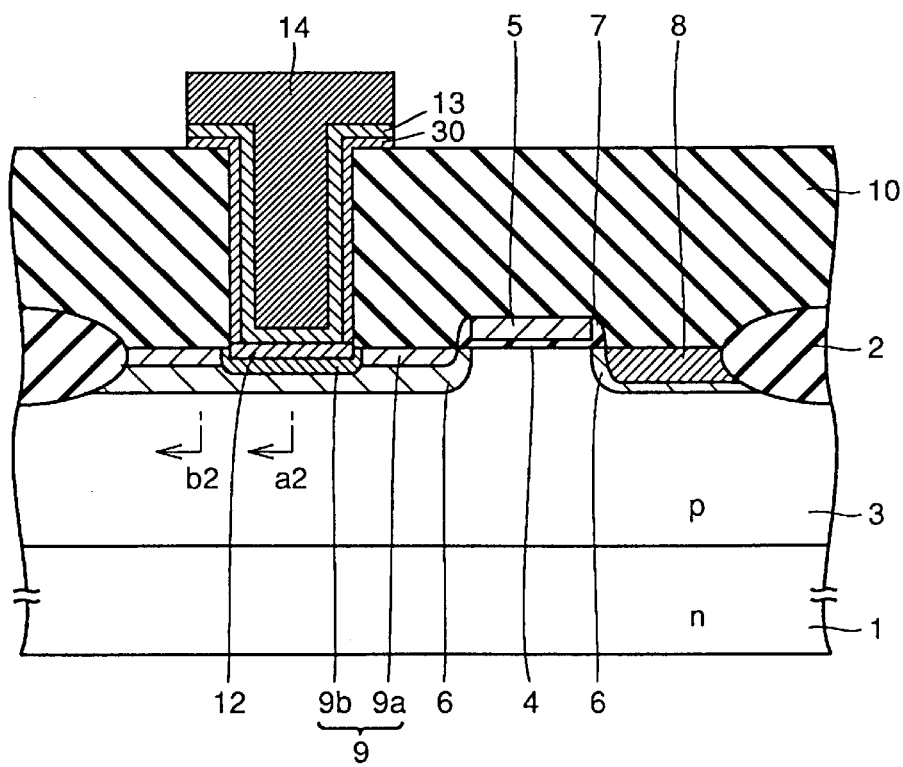
FIG. 15 is a sectional view showing the structure of an SRAM memory cell according to an embodiment 2 of the present invention.
Figure 16:
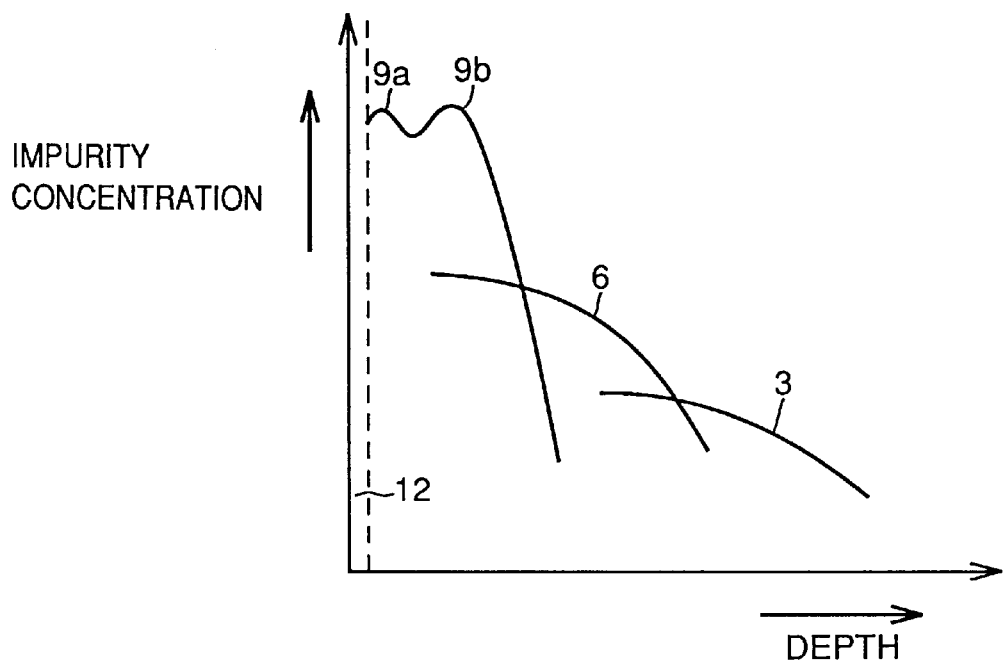
FIG. 16 illustrates an impurity concentration profile along arrow a2 in FIG. 15.
Figure 17:
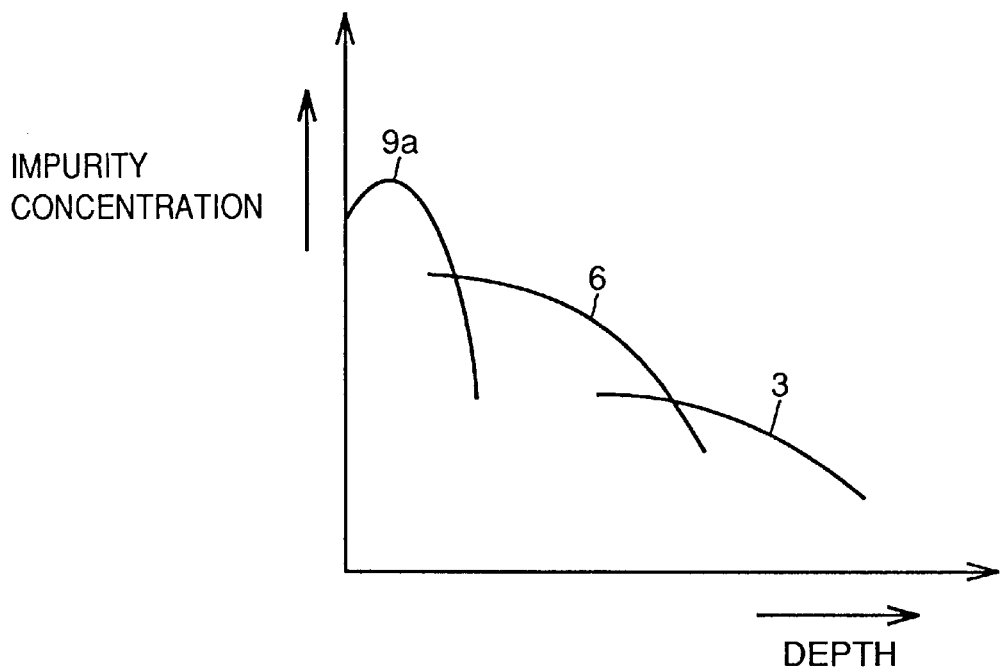
FIG. 17 illustrates an impurity concentration profile along arrow b2 in FIG. 15.

FIGS. 16 and 17 illustrate impurity concentration profiles along arrows a2 and b2 in FIG. 15 respectively.

Comparing the profiles shown in FIGS. 16 and 17 with each other, it is understood that no impurity is present in the portion of the TiSi film 12 in the impurity concentration profile shown in FIG. 16. It is also understood that the emitter region 9 forms a high-concentration impurity layer by two impurity concentration peaks of the first and second impurity layers 9a and 9b and that the impurity concentration peak of the second impurity layer 9b is located on a deeper position than that of the first impurity layer 9a.

A method of fabricating the semiconductor device having the aforementioned structure is now described with reference to FIGS. 18 to 24.

Figure 18:
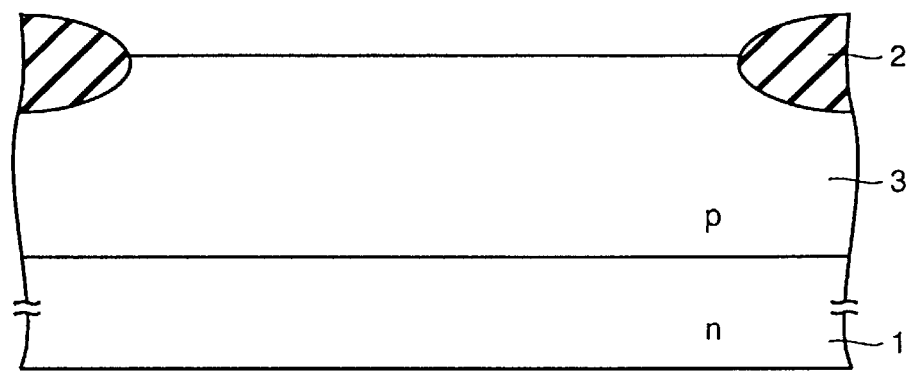
FIGS. 18 to 24 are sectional views showing first to seventh steps of a method of fabricating the SRAM memory cell shown in FIG. 15 respectively.

Referring to FIG. 18, a p-type impurity such as BF$_2$ or B is introduced up to a position of a prescribed depth from the major surface of the n-type semiconductor substrate 1, for forming the p-type well and collector region 3 having the impurity concentration of $1 \times 10^{16}$ to $5 \times 10^{17}$ cm$^{-3}$. Thereafter the isolation oxide films 2 are formed by the LOCOS method or the like, for defining the active region on the major surface of the n-type semiconductor substrate 1.

Figure 19:
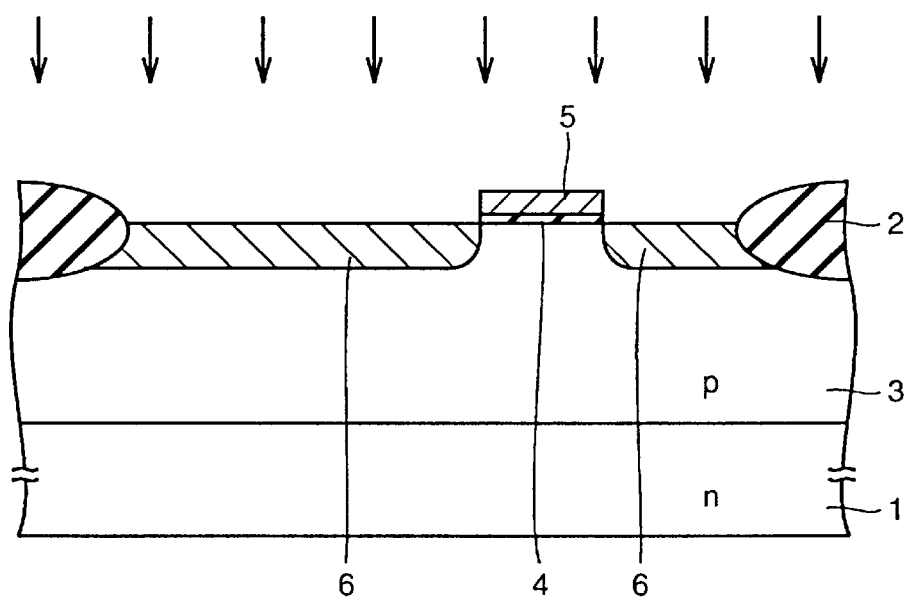

Referring to FIG. 19, the gate electrode 5 is formed on the major surface of the n-type semiconductor substrate 1 through the gate oxide film 4, and an n-type impurity such as P or As is introduced through the gate electrode 5 and the isolation oxide films 2 serving as masks in conditions of an injection rate of $1 \times 10^{13}$ to $1 \times 10^{14}$ cm$^{-2}$ and injection energy of 30 to 100 keV, for forming the n-type source/drain regions/base region 6 having the impurity concentration of $5 \times 10^{17}$ to $5 \times 10^{19}$ cm$^{-3}$.

Figure 20:
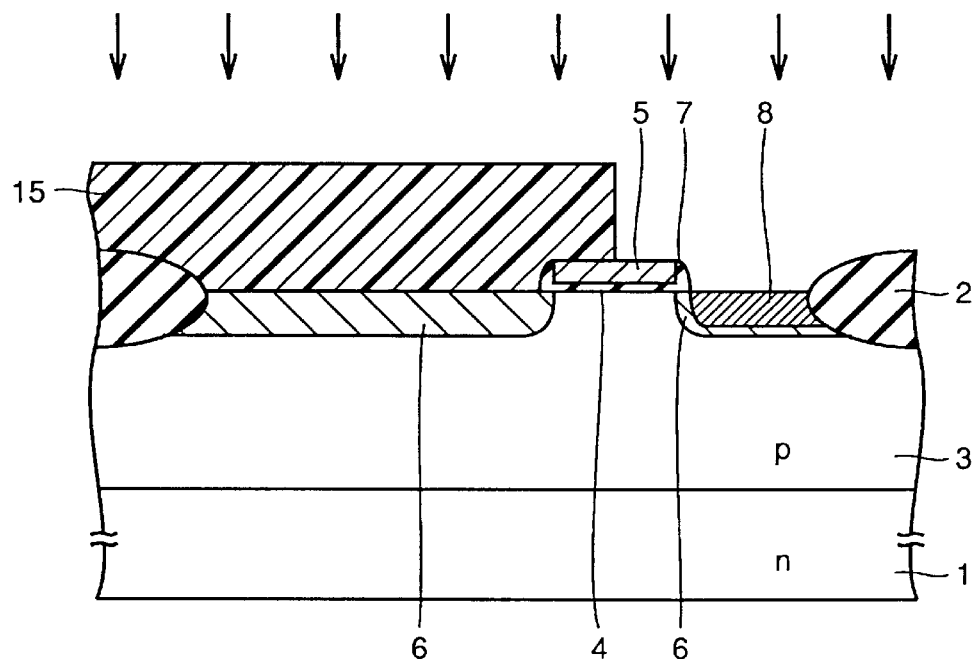

Referring to FIG. 20, the side wall oxide films 7 are formed on the side wall portions of the gate electrode 5, the base region 6 is covered with a resist film 15, and thereafter an n-type impurity such as As is introduced into the remaining source/drain region 6 in conditions of an injection rate of $1 \times 10^{15}$ to $5 \times 10^{15}$ cm$^{-2}$ and injection energy of 10 to 60 keV, for forming the n-type source/drain region 8 having the impurity concentration of $1 \times 10^{20}$ to $1 \times 10^{22}$ cm$^{-3}$.

Figure 21:
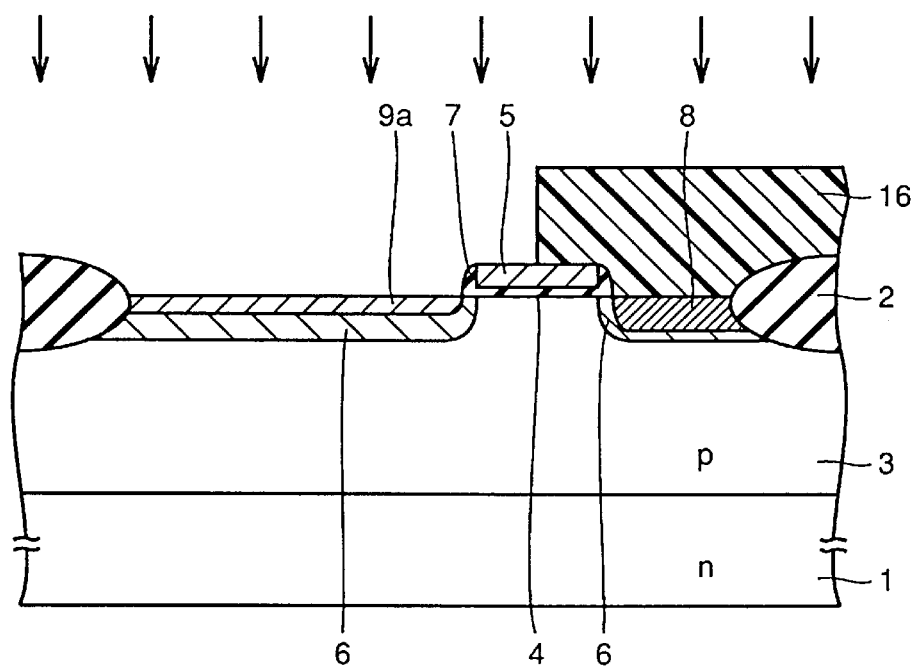

Referring to FIG. 21, the resist film 15 is removed, the source/drain regions 6 and 8 are covered with another resist film 16, and a p-type impurity such as BF$_2$ or B is injected into the base region 6 in a self-alignment manner through the resist film 16, the gate electrode 5, the side wall oxide films 7 and the isolation oxide films 2 serving as masks in conditions of an injection rate of $1 \times 10^{13}$ to $5 \times 10^{14}$ cm$^{-2}$ and injection energy of 5 to 30 keV, for forming the p-type first impurity layer 9a having the impurity concentration of $5 \times 10^{17}$ to $1 \times 10^{20}$ cm$^{-3}$.

Figure 22:
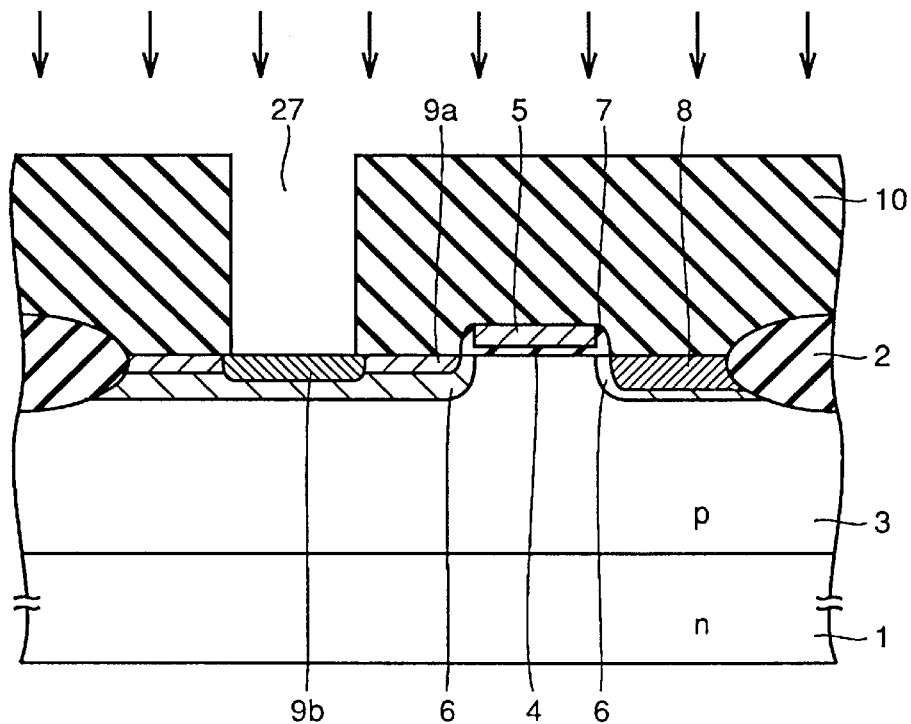

Referring to FIG. 22, the resist film 16 is removed, the interlayer isolation film 10 is formed on the n-type semiconductor substrate 1, and a contact hole 27 is formed to partially expose the n-type base region 6. Thereafter a p-type impurity such as BF$_2$ or B is injected through the interlayer isolation film 10 serving as a mask in conditions of an injection rate of $5 \times 10^{14}$ to $2 \times 10^{15}$ cm$^{-2}$ and injection energy of 20 to 100 keV, for forming the p-type second impurity layer 9b having the impurity concentration of $5 \times 10^{19}$ to $1 \times 10^{21}$ cm$^{-3}$. These p-type first and second impurity layers 9a and 9b form the emitter region 9 of the bipolar transistor.

Figure 23:
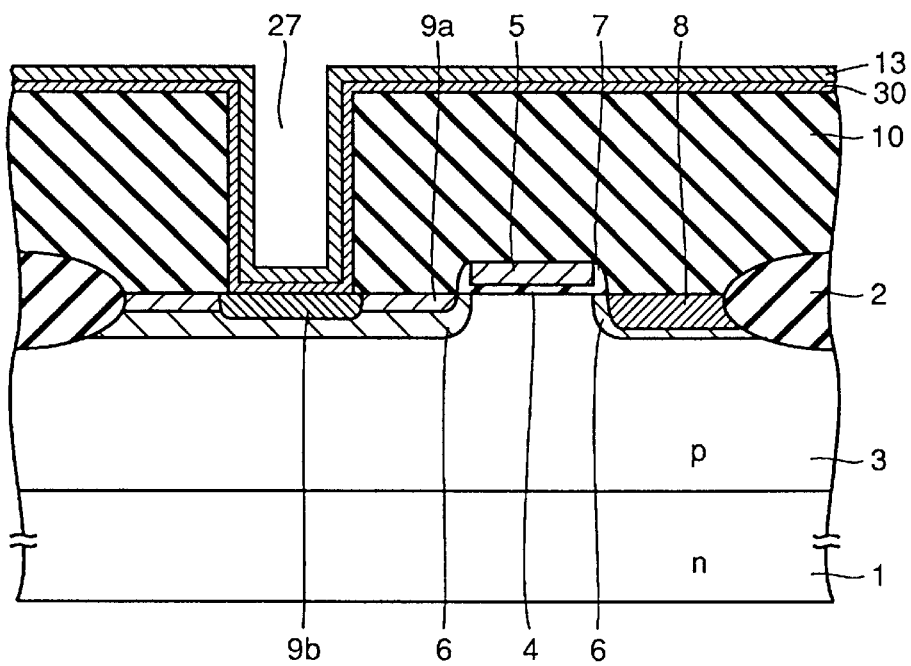
Figure 24:
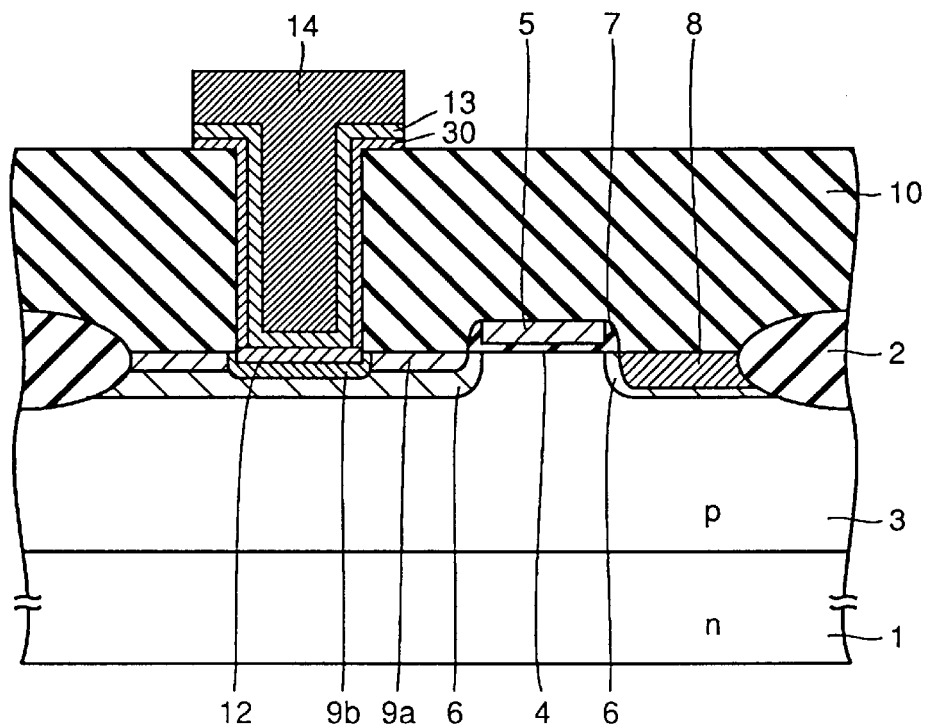

Referring to FIG. 23, the Ti film 30 of 100 to 500 Å and the TiN film 13 of 500 to 2000 Å are formed by sputtering. Thereafter heat treatment is performed for forming the TiSi film 12 on the interface between the second impurity layer 9b and the Ti film 30, as shown in FIG. 24. Thereafter the wiring layer 14 consisting of a metal such as Al is deposited in the contact hole 27, and the wiring layer 14, the TiN film 13 and the Ti film 30 are patterned. Thus, the semiconductor device shown in FIG. 15 is completed.

In the semiconductor device and the method of fabricating the same according to this embodiment, the second impurity layer 9b is formed in the region provided with a contact part for forming the emitter region 9 by the first and second impurity layers 9a and 9b in order to prevent reduction of the impurity concentration of the emitter region 9 dissimilarly to the semiconductor device according to the embodiment 1, thereby enabling formation of excellent ohmic contact between the second impurity layer 9b and the wiring layer 14 and improving the operability of an SRAM memory cell.

Embodiment 3

In the aforementioned semiconductor device according to the embodiment 2, the first impurity layer 9a is formed on the overall surface of a bipolar transistor forming part, in order to prevent reduction of the impurity concentration of the emitter region 9. In the embodiment 2, however, punch-through is readily caused between the p-type first impurity layer 9a and the collector region 3 on an edge portion of one of the isolation oxide films 2 if the impurity is deeply injected or diffused by additional heat treatment to be further deeply injected. Accordingly, a semiconductor device according to an embodiment 3 of the present invention is adapted to prevent reduction of voltage resistance on the edge portion of one of the isolation oxide films 2 in the embodiment 2.

The semiconductor device according to this embodiment is now described with reference to FIG. 25.

A p-type well and collector region 3 having an impurity concentration of $1\times10^{16}$ to $5\times10^{17}$ cm$^{-3}$ is formed up to a position of a prescribed depth from a major surface of an n-type semiconductor substrate 1 consisting of silicon or the like, and isolation oxide films 2 for defining an active region are formed on the major surface of the n-type semiconductor substrate 1.

In the active region, a gate electrode 5 is formed on the major surface of the n-type semiconductor substrate 1 through a gate oxide film 4, and side wall oxide films 7 are formed on side wall portions of the gate electrode 5.

The p-type well and collector region 3 is provided with n-type source/drain regions 6 and 8 having impurity concentrations of $5\times10^{17}$ to $5\times10^{19}$ cm$^{-3}$ and $1\times10^{20}$ to $1\times10^{22}$ cm$^{-3}$ respectively, to hold the gate electrode 5 therebetween.

One of the source/drain regions 6 serves also as a base region 6 of a bipolar transistor, and a p-type first impurity layer 17a having an impurity concentration of $5\times10^{17}$ to $1\times10^{20}$ cm$^{-3}$ is formed in this base region 6.

This p-type first impurity layer 17a is formed not to be in contact with an edge portion of one of the isolation oxide films 2. Due to this structure, it is possible to prevent punch-through between the p-type first impurity layer 17a and the collector region 3 on the edge portion of one of the isolation oxide films 2.

A p-type second impurity layer 17b having an impurity concentration of $5\times10^{19}$ to $1\times10^{21}$ cm$^{-3}$ is formed in the p-type first impurity layer 17a to be enclosed with this p-type first impurity layer 17a. The p-type first and second impurity layers 17a and 17b form an emitter region 17 of the bipolar transistor.

An interlayer isolation film 10 having a contact hole reaching the p-type second impurity layer 17b is formed on the surface of the n-type semiconductor substrate 1.

The p-type second impurity layer 17b is connected with a wiring layer 14 consisting of a metal such as Al through the contact hole with interposition of a TiSi film 12, a Ti film 30 and a TiN film 13.

Figure 25:
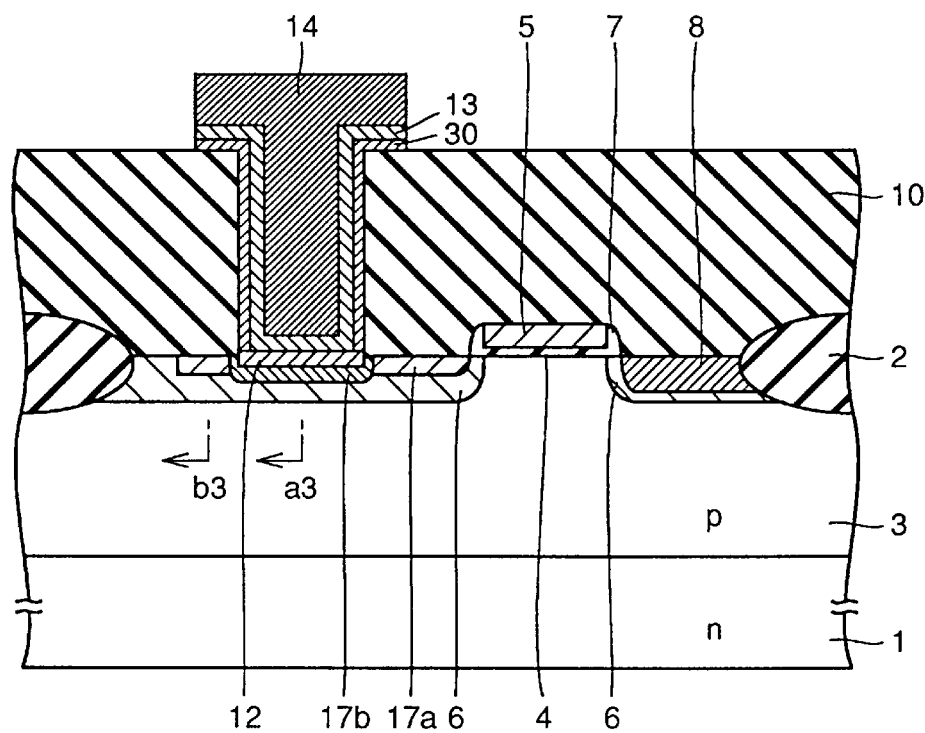
FIG. 25 is a sectional view showing the structure of an SRAM memory cell according to an embodiment 3 of the present invention.
Figure 26:
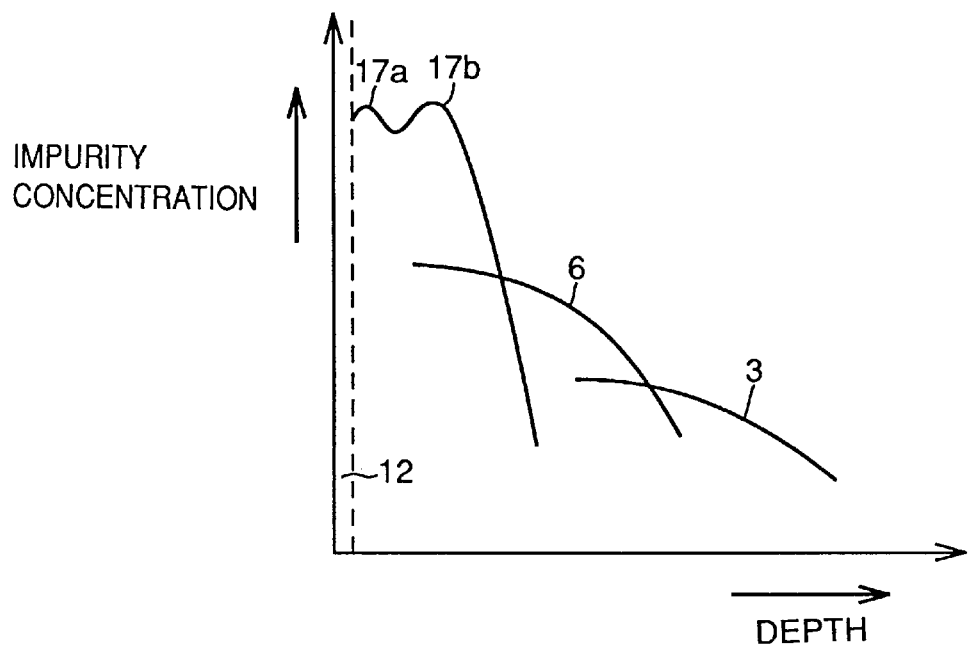
FIG. 26 illustrates an impurity concentration profile along arrow a3 in FIG. 25.
Figure 27:
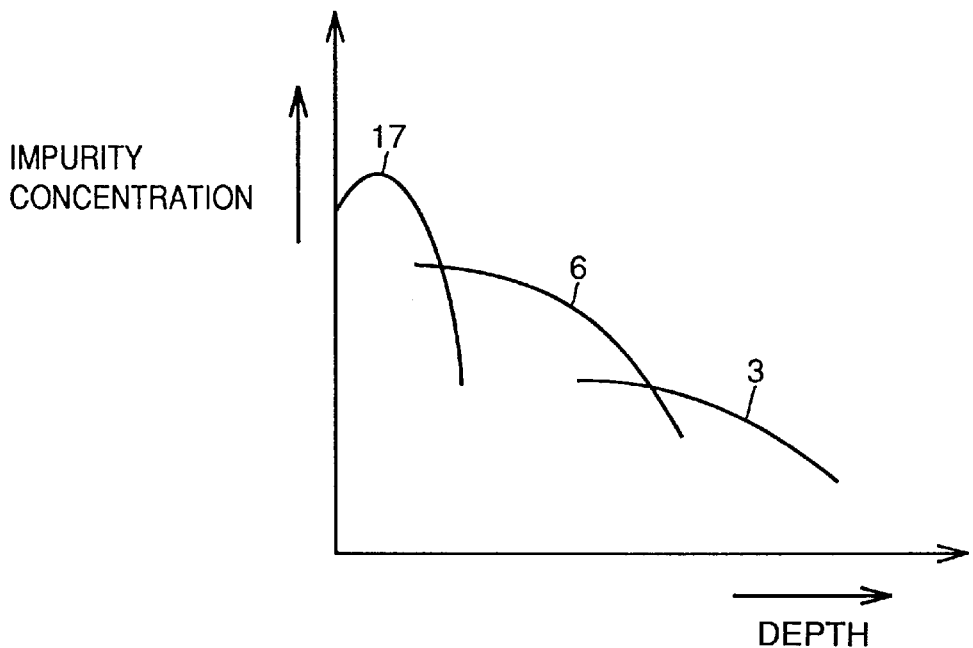
FIG. 27 illustrates an impurity concentration profile along arrow b3 in FIG. 25.

FIGS. 26 and 27 illustrate impurity concentration profiles along arrows a3 and b3 in FIG. 25 respectively.

Comparing the profiles shown in FIGS. 26 and 27 with each other, it is understood that no impurity is present in the portion of the TiSi film 12 in the impurity concentration profile shown in FIG. 26. It is also understood that the emitter region 17 forms a high-concentration impurity layer by two impurity concentration peaks of the first and second impurity layers 17a and 17b, and that the impurity concentration peak of the second impurity layer 17b is located on a deeper position than that of the first impurity layer 17a.

A method of fabricating the semiconductor device shown in FIG. 25 is now described with reference to FIGS. 28 to 34.

Figure 28:
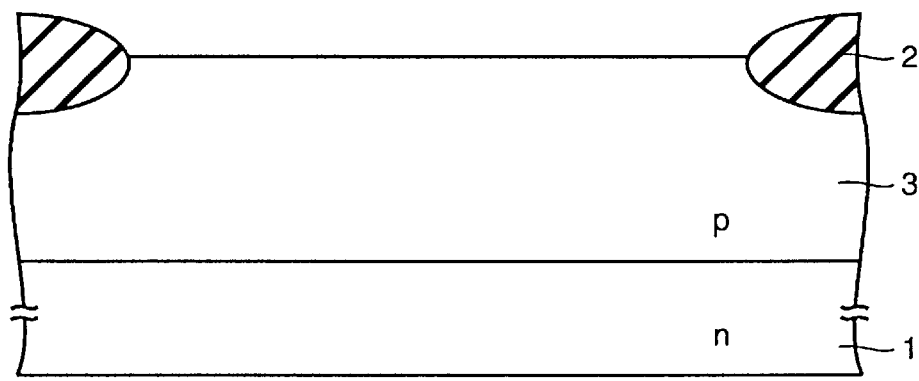
FIGS. 28 to 34 are sectional views showing first to seventh steps of a method of fabricating the SRAM memory cell shown in FIG. 25 respectively.

Referring to FIG. 28, a p-type impurity such as BF$_2$ or B is introduced up to a position of a prescribed depth from the major surface of the n-type semiconductor substrate 1, for forming the p-type well and collector region 3 having the impurity concentration of $1\times10^{16}$ to $5\times10^{17}$ cm$^{-3}$. Thereafter the isolation oxide films 2 are formed by the LOCOS method or the like, for forming the active region on the major surface of the n-type semiconductor substrate 1.

Figure 29:
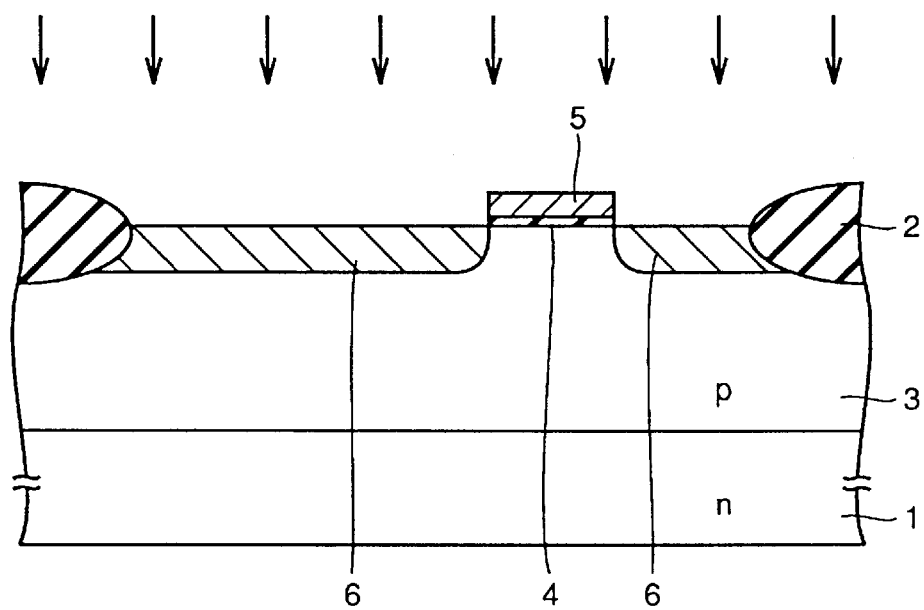

Referring to FIG. 29, the gate electrode 5 is formed on the major surface of the n-type semiconductor substrate 1 through the gate oxide film 4, and thereafter an n-type impurity such as P or As is introduced through the gate electrode 5 and the isolation oxide films 2 serving as masks in conditions of an injection rate of $1\times10^{13}$ to $1\times10^{14}$ cm$^{-2}$ and injection energy of 30 to 100 keV, for forming the n-type source/drain regions/base region 6 having the impurity concentration of $5\times10^{17}$ to $5\times10^{19}$ cm$^{-3}$.

Figure 30:
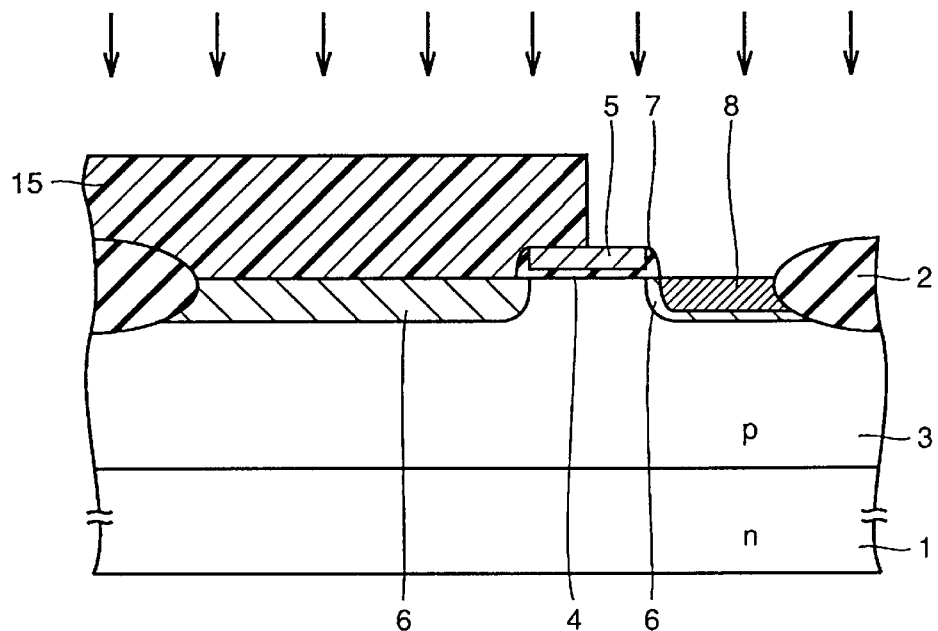

Referring to FIG. 30, the side wall oxide films 7 are formed on the side wall portions of the gate electrode 5, the base region 6 is covered with a resist film 15, and thereafter an n-type impurity such as As is introduced into the remaining source/drain region 6 in conditions of an injection rate of $1\times10^{15}$ to $5\times10^{15}$ cm$^{-2}$ and injection energy of 10 to 60 keV, for forming the n-type source/drain region 8 having the impurity concentration of $1\times10^{20}$ to $1\times10^{22}$ cm$^{-3}$.

Figure 31:
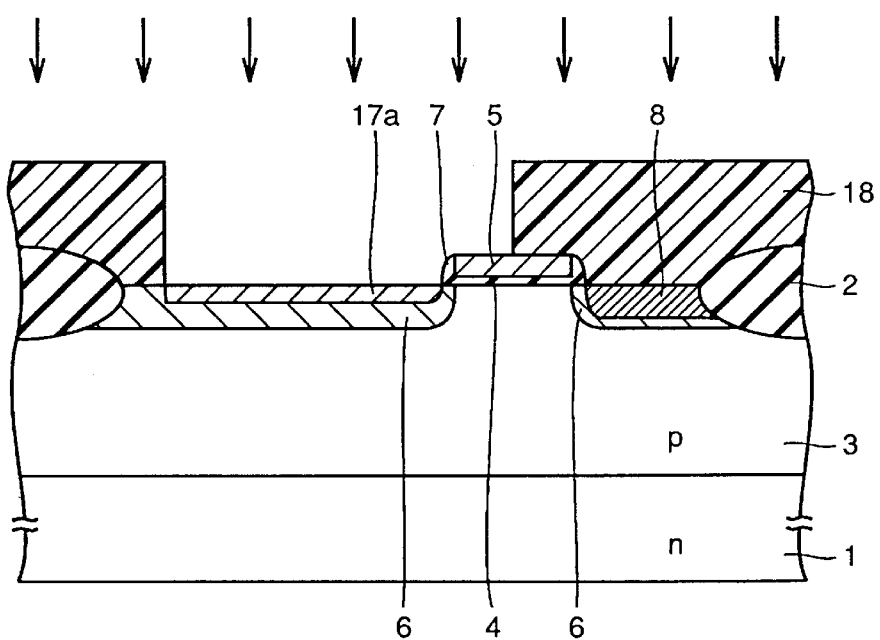

Referring to FIG. 31, the resist film 15 is removed, the source/drain regions 6 and 8 are covered with other resist films 18, and thereafter a p-type impurity such as BF$_2$ or B is introduced into the base region 6 through the resist films 18, the gate electrode 5, the side wall oxide films 7 and the isolation oxide films 2 serving as masks in conditions of an injection rate of $1\times10^{13}$ to $5\times10^{14}$ cm$^{-2}$ and injection energy of 5 to 30 keV, for forming the p-type first impurity layer 17a having the impurity concentration of $5\times10^{17}$ to $1\times10^{20}$ cm$^{-3}$. At this time, the resist films 18 are so formed as to cover an edge portion of one of the isolation oxide films 2 on the base region 6. Thus, no p-type impurity is introduced into the edge portion of this isolation oxide film 2, whereby the p-type first impurity layer 17a can be implemented in a shape not in contact with the edge portion of this isolation oxide film 2.

Figure 32:
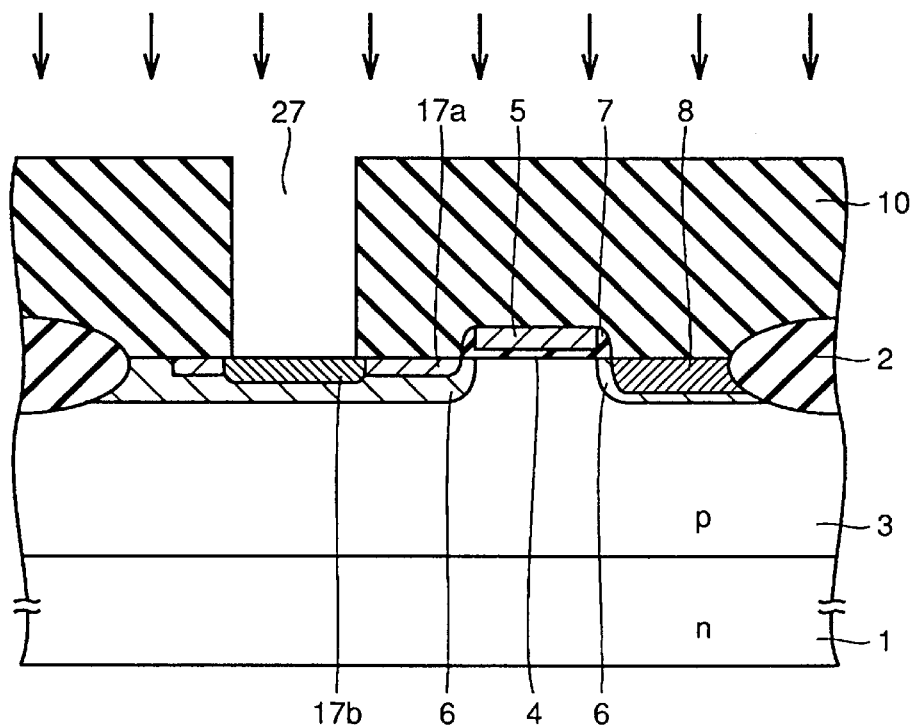

Referring to FIG. 32, the resist films 18 are removed, the interlayer isolation film 10 is formed on the n-type semiconductor substrate 1, and thereafter a contact hole 27 is formed to partially expose the n-type base region 6. Thereafter a p-type impurity such as BF$_2$ or B is introduced through the interlayer isolation film 10 serving as a mask in conditions of an injection rate of $5\times10^{14}$ to $2\times10^{15}$ cm$^{-2}$ and injection energy of 20 to 100 keV, for forming the p-type second impurity layer 17b having the impurity concentration of $5\times10^{19}$ to $1\times10^{21}$ cm$^{-3}$. This p-type second impurity layer 17b and the aforementioned p-type first impurity layer 17a form the emitter region 17 of the bipolar transistor.

Figure 33:
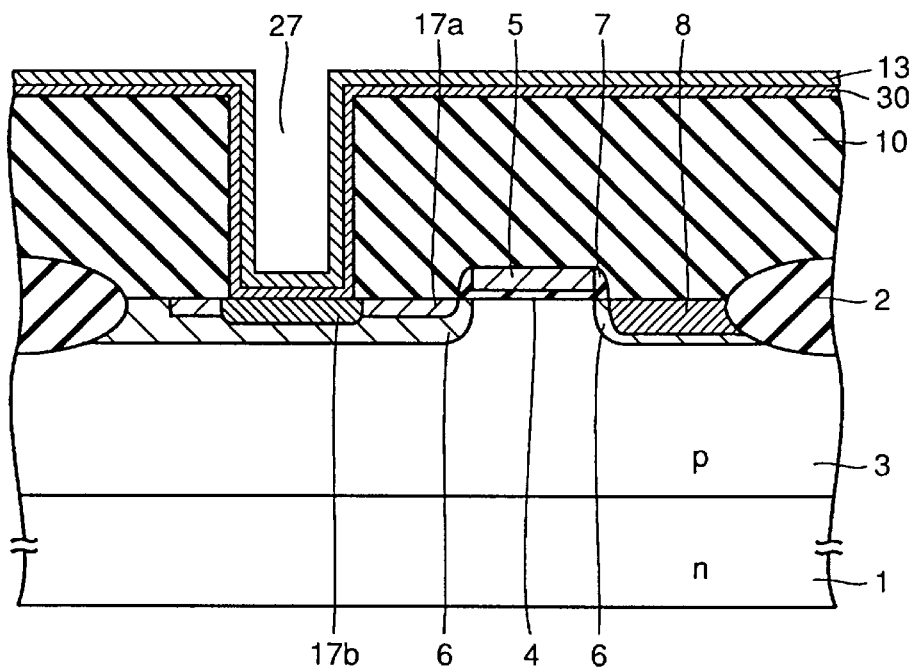
Figure 34:
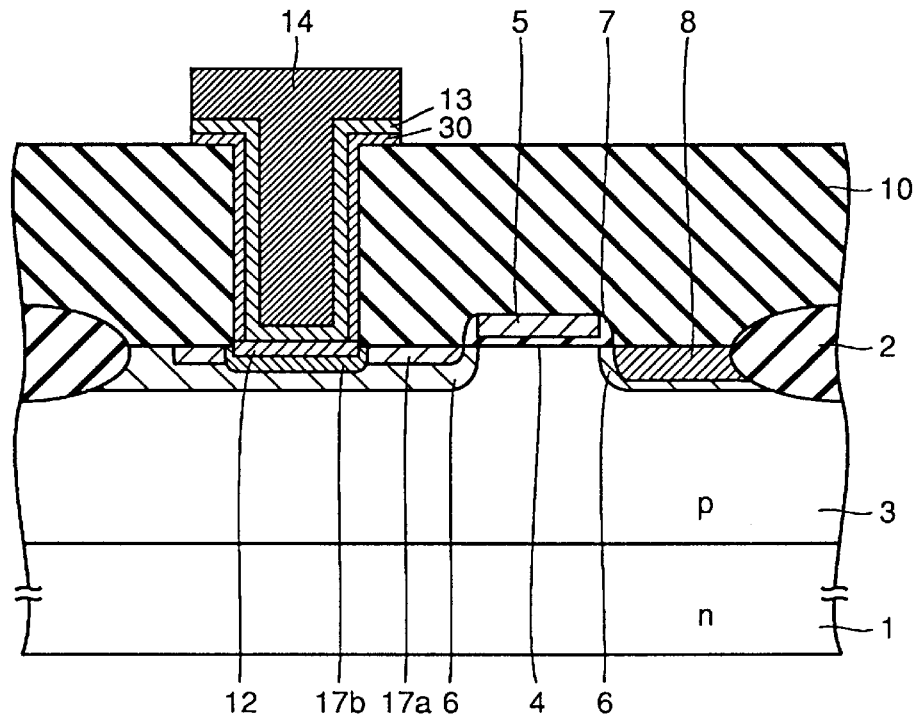

Referring to FIG. 33, the TiN film 30 of 100 to 500 Å and the TiN film 13 of 500 to 2000 Å are formed by sputtering. Thereafter heat treatment is performed for forming the TiSi film 12 on the interface between the p-type second impurity layer 17b and the Ti film 30, as shown in FIG. 34. Thereafter the wiring layer 14 consisting of a metal such as Al is deposited in the contact hole 27, and the wiring layer 14, the TiN film 13 and the Ti film 30 are patterned. Thus, the semiconductor device shown in FIG. 25 is completed.

In the semiconductor device and the method of fabricating the same according to this embodiment, punch-through can be prevented between the p-type first impurity layer 17a and one of the isolation oxide films 2 in addition to the function/effect attained by the aforementioned semiconductor device according to the embodiment 2, whereby the operability of an SRAM memory cell can be further improved.

Embodiment 4

In the structure of the semiconductor device according to each of the embodiments 2 and 3, the p-type second impurity layer 9b or 17b is formed for increasing the p-type impurity concentration in the vicinity of the surface of the n-type semiconductor substrate 1, in order to attain an excellent ohmic junction in the emitter region 9 or 17 of the bipolar transistor.

However, the area of the p-type second impurity layer 9b or 17b, which is equal to the contact size, is so reduced that no high collector current can be obtained. In order to obtain a high collector current, therefore, it is necessary to increase the effective emitter area.

Accordingly, an embodiment 4 of the present invention aims at increasing the collector current by forming an emitter region on the overall surface of a bipolar transistor forming part enclosed with a gate electrode and an isolation oxide film thereby increasing the emitter area.

The structure of a semiconductor device according to the embodiment 4 is now described with reference to FIG. 35.

A p-type well and collector region 3 having an impurity concentration of $1\times10^{16}$ to $5\times10^{17}$ cm$^{-3}$ is formed up to a position of a prescribed depth from a major surface of an n-type semiconductor substrate 1 consisting of silicon or the like, and isolation oxide films 2 for defining an active region are formed on the major surface of the n-type semiconductor substrate 1.

In the active region, a gate electrode 5 is formed on the major surface of the n-type semiconductor substrate 1 through a gate oxide film 4, and side wall oxide films 7 are formed on side wall portions of the gate electrode 5.

The p-type well and collector region 3 is provided with n-type source/drain regions 6 and 8 having impurity concentrations of $5\times10^{17}$ to $5\times10^{19}$ cm$^{-3}$ and $1\times10^{20}$ to $1\times10^{22}$ cm$^{-3}$ respectively, to hold the gate electrode 5 therebetween.

One of the source/drain regions 6 serves also as a base region 6 of a bipolar transistor, and a p-type emitter region 21 having an impurity concentration of $5\times10^{19}$ to $1\times10^{22}$ cm$^{-3}$ is formed in the base region 6. An interlayer isolation film 10 having a contact hole reaching the p-type emitter region 21 is formed on the surface of the n-type semiconductor substrate 1.

The p-type emitter region 21 is connected with a wiring layer 14 consisting of a metal such as Al through the contact hole with interposition of a TiSi film 12, a Ti film 30 and a TiN film 13, to form ohmic contact.

Figure 35:
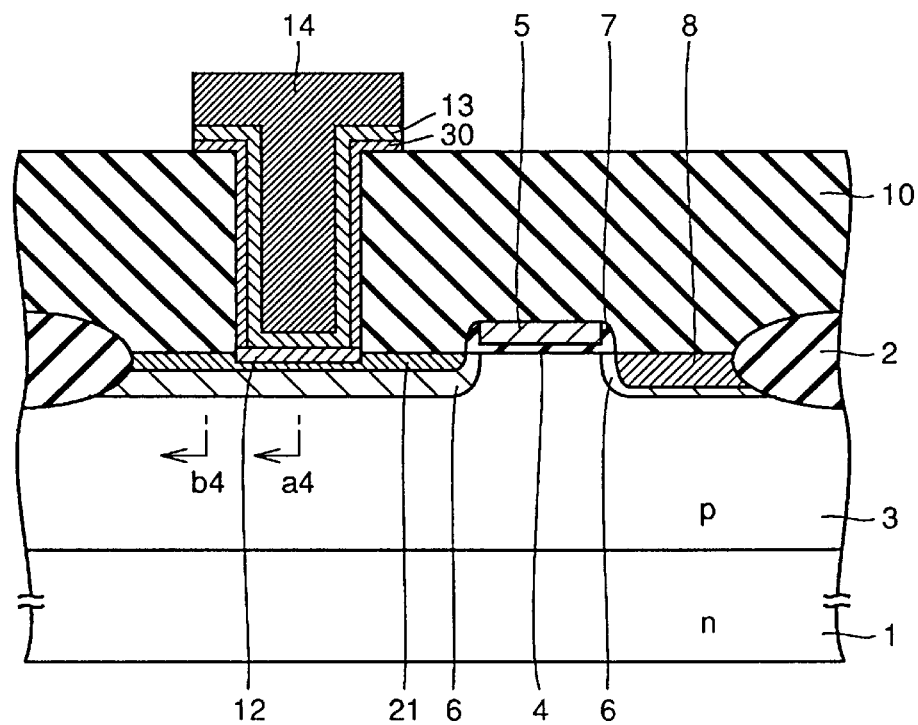
FIG. 35 is a sectional view showing the structure of an SRAM cell according to an embodiment 4 of the present invention.
Figure 36:
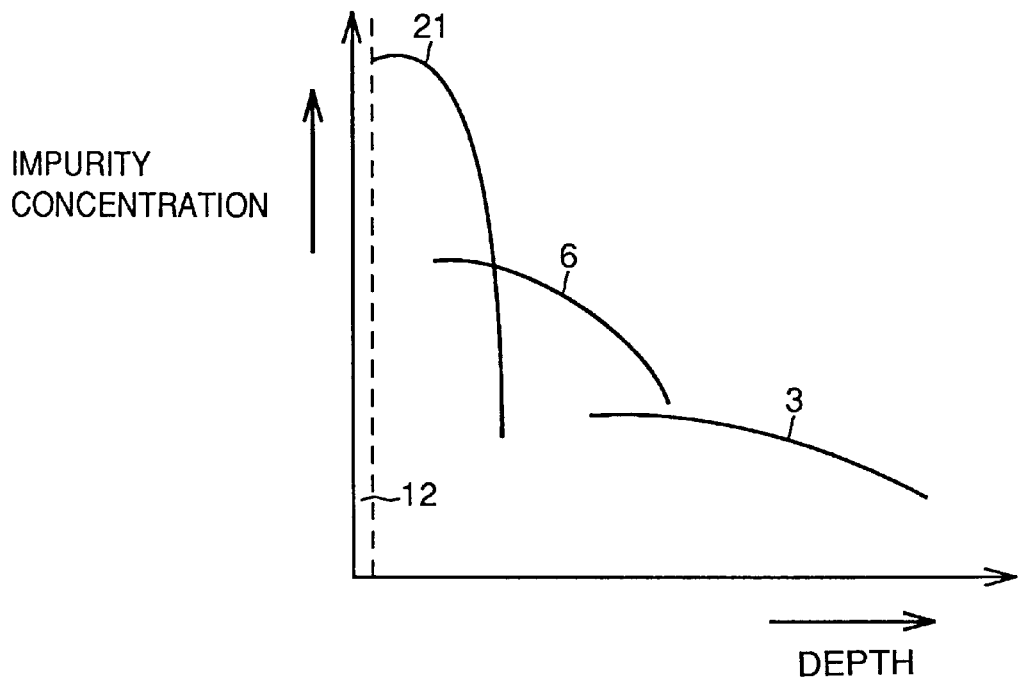
FIG. 36 illustrates an impurity concentration profile along arrow a4 in FIG. 35.
Figure 37:
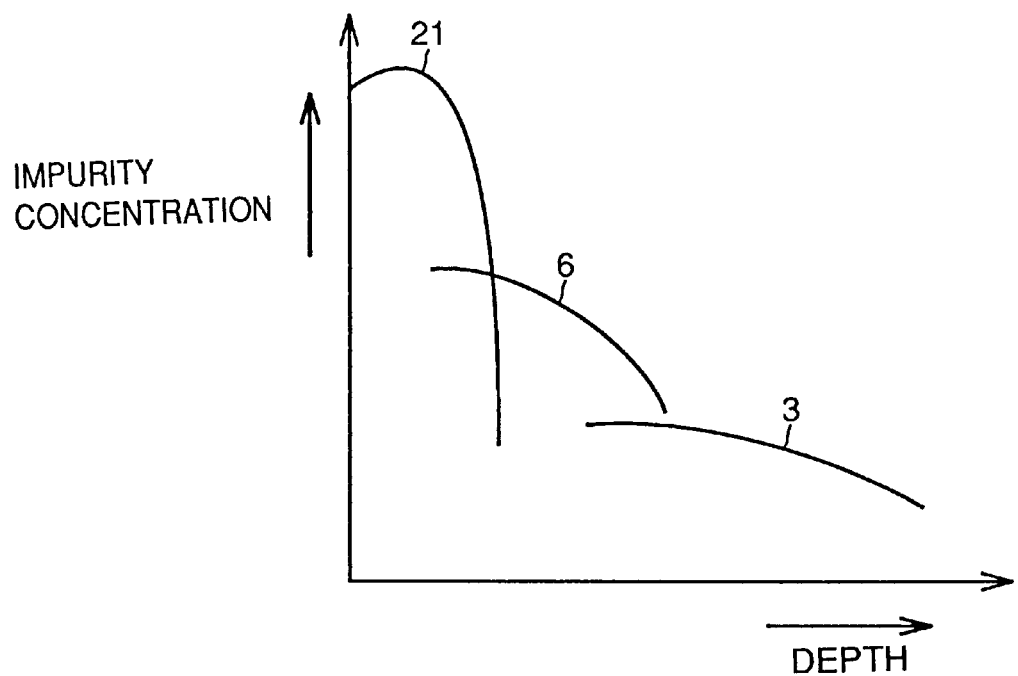
FIG. 37 illustrates an impurity concentration profile along arrow b4 in FIG. 35.

FIGS. 36 and 37 illustrate impurity concentration profiles along arrows a4 and b4 in FIG. 35 respectively.

A method of fabricating the semiconductor device having the aforementioned structure is now described with reference to FIGS. 38 to 43.

Figure 38:
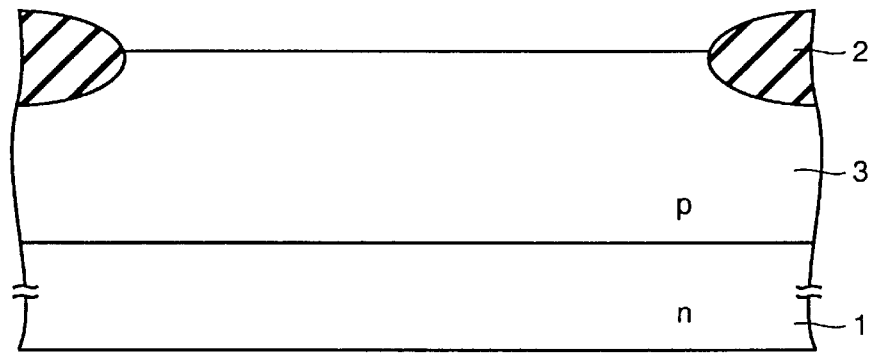
FIGS. 38 to 43 are sectional views showing first to sixth steps of a method of fabricating the SRAM memory cell shown in FIG. 35 respectively.

Referring to FIG. 38, a p-type impurity such as BF$_2$ or B is introduced up to a position of a prescribed depth from the major surface of the n-type semiconductor substrate 1, for forming the p-type well and collector region 3 having the impurity concentration of $1\times10^{16}$ to $5\times10^{17}$ cm$^{-3}$. Thereafter the isolation oxide films 2 are formed by the LOCOS method or the like for defining the active region on the major surface of the n-type semiconductor substrate 1.

Figure 39:
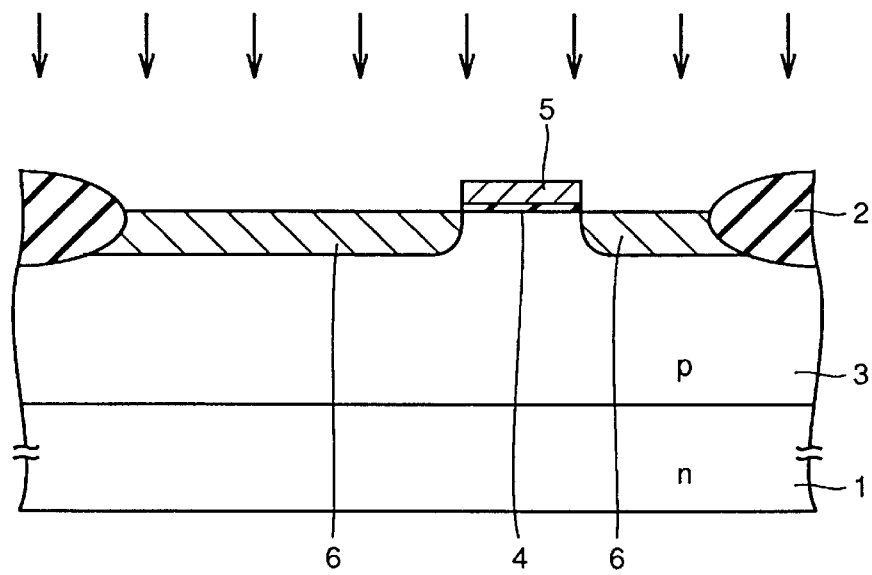

Referring to FIG. 39, the gate electrode 5 is formed on the major surface of the n-type semiconductor substrate 1 through the gate oxide film 4, and an n-type impurity such as P or As is introduced through the gate electrode 4 and the isolation oxide films 2 serving as masks in conditions of an injection rate of $1\times10^{13}$ to $1\times10^{14}$ cm$^{-2}$ and injection energy of 30 to 100 keV, for forming the n-type source/drain regions/base region 6 having the impurity concentration of $5\times10^{17}$ to $5\times10^{19}$ cm$^{-3}$.

Figure 40:
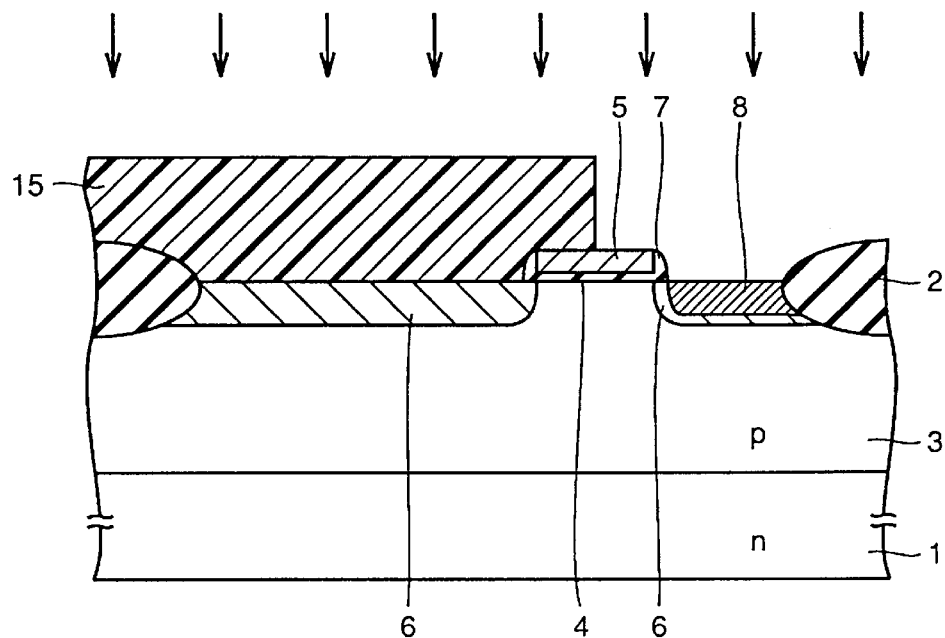

Referring to FIG. 40, the side wall oxide films 7 are formed on the side wall portions of the gate electrode 5, the base region 6 is covered with a resist film 15, and thereafter an n-type impurity such as As is introduced into the remaining source/drain region 6 in conditions of an injection rate of $1\times10^{15}$ to $5\times10^{15}$ cm$^{-2}$ and injection energy of 10 to 60 keV, for forming the source/drain region 8 having the impurity concentration of $1\times10^{20}$ to $1\times10^{22}$ cm$^{-3}$.

Figure 41:
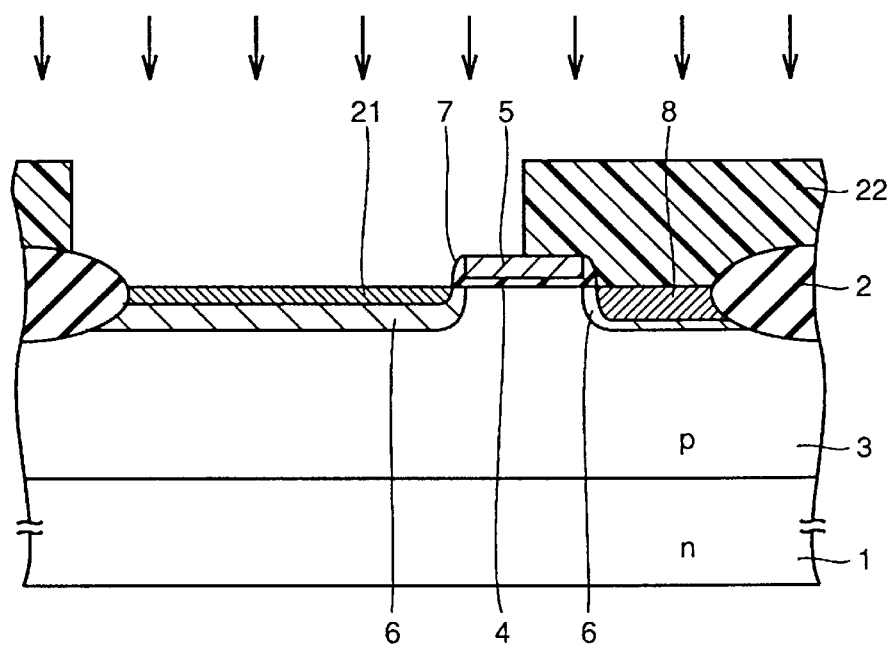

Referring to FIG. 41, the resist film 15 is removed, the source/drain regions 6 and 8 are covered with another resist film 22, and a p-type impurity such as BF$_2$ or B is introduced into the base region 6 in a self-alignment manner through the resist film 22, the gate electrode 5, the side wall oxide films 7 and the isolation oxide films 2 serving as masks in conditions of an injection rate of $1\times10^{14}$ to $5\times10^{15}$ cm$^{-2}$ and injection energy of 5 to 30 keV, for forming the p-type emitter region 21 having the impurity concentration of $5\times10^{19}$ to $1\times10^{22}$ cm$^{-3}$.

Figure 42:
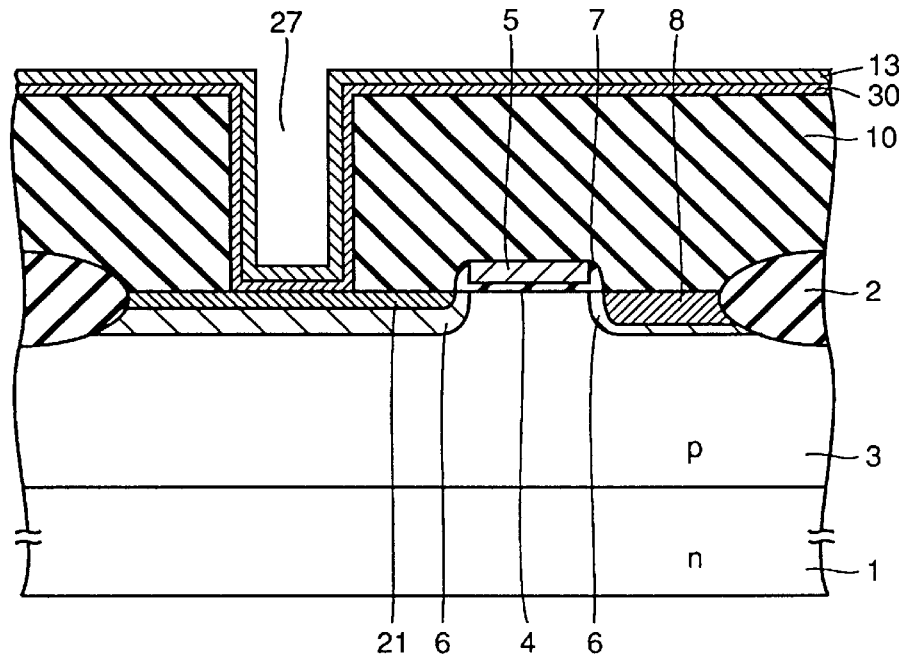

Referring to FIG. 42, the resist film 22 is removed, the interlayer isolation film 10 is formed on the n-type semiconductor substrate 1, and thereafter a contact hole 27 is formed to partially expose the n-type base region 6. Thereafter the Ti film 30 of 100 to 500 Å and the TiN film 13 of 500 to 2000 Å are formed by sputtering.

Figure 43:
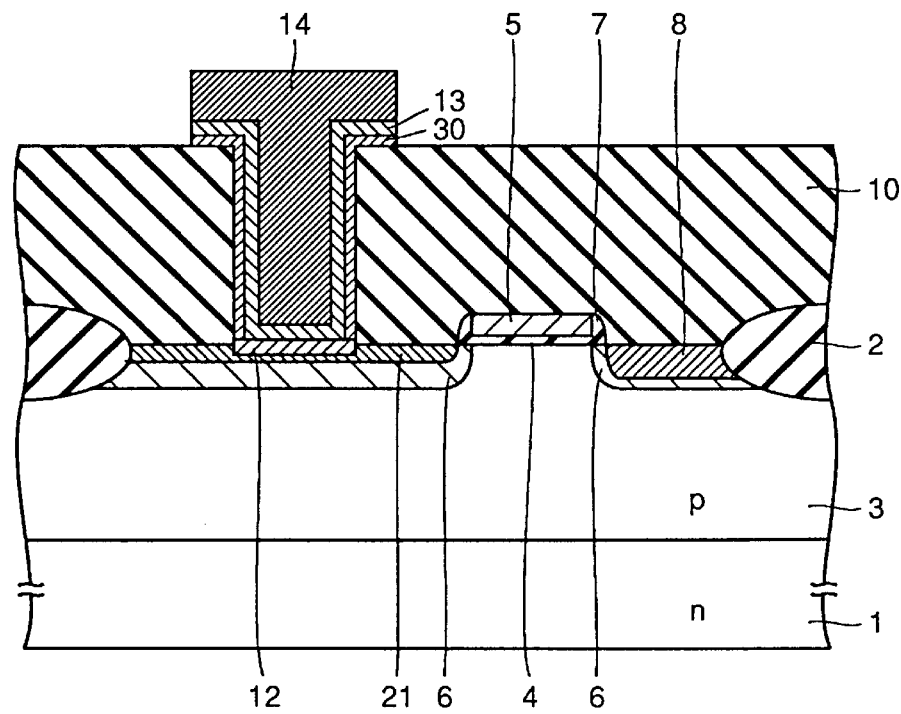

Then, heat treatment is performed for forming the TiSi film 12 on the interface between the emitter region 21 and the Ti film 30, as shown in FIG. 43. Thereafter the wiring layer 14 consisting of a metal such as Al is deposited in the contact hole 27, and the wiring layer 14, the TiN film 13 and the Ti film 30 are patterned. Thus, the semiconductor device shown in FIG. 35 is completed.

As hereinabove described, the semiconductor device and the method of fabricating the same according to this embodiment can increase the collector current by forming the emitter region 21 on the overall surface of the bipolar transistor forming part enclosed with the gate electrode 5 and one of the isolation oxide films 2 and increasing the area of the emitter region 21. Thus, the operability of an SRAM memory cell can be improved.

Embodiment 5

In the aforementioned semiconductor device according to the embodiment 4, the emitter region 21 is formed on the overall surface of the bipolar transistor forming part. In the embodiment 4, however, punch-through is readily caused between the p-type emitter region 21 and the collector region 3 on an edge portion of one of the isolation oxide films 2 if the impurity is deeply injected or diffused by additional heat treatment to be further deeply injected. Accordingly, a semiconductor device according to an embodiment 5 of the present invention is adapted to prevent reduction of voltage resistance on the edge portion of one of the isolation oxide films 2 in the embodiment 4.

The structure of the semiconductor device according to this embodiment is now described with reference to FIG. 44.

A p-type well and collector region 3 having an impurity concentration of $1 \times 10^{16}$ to $5 \times 10^{17}$ cm$^{-3}$ is formed up to a position of a prescribed depth from a major surface of an n-type semiconductor substrate 1 consisting of silicon or the like, and isolation oxide films 2 for defining an active region are formed on the major surface of the n-type semiconductor substrate 1.

In the active region, a gate electrode 5 is formed on the major surface of the n-type semiconductor substrate 1 through a gate oxide film 4, and side wall oxide films 7 are formed on side wall portions of the gate electrode 5.

The p-type well and collector region 3 is provided with n-type source/drain regions 6 and 8 having impurity concentrations of $5 \times 10^{17}$ to $5 \times 10^{19}$ cm$^{-3}$ and $1 \times 10^{20}$ to $1 \times 10^{22}$ cm$^{-3}$ respectively, to hold the gate electrode 5 therebetween.

One of the source/drain regions 6 serves also as a base region 6 of a bipolar transistor, and a p-type emitter region 19 having an impurity concentration of $5 \times 10^{19}$ to $1 \times 10^{22}$ cm$^{-3}$ is formed in the base region 6. This p-type emitter region 19 is formed not to be in contact with an edge portion of one of the isolation oxide films 2. Thus, it is possible to prevent punch-through between the p-type emitter region 19 and the collector region 3 on the edge portion of this isolation oxide film 2.

An interlayer isolation film 10 having a contact hole reaching the p-type emitter region 19 is formed on the surface of the n-type semiconductor substrate 1.

The p-type emitter region 19 is connected with a wiring layer 14 consisting of a metal such as Al through the contact hole with interposition of a TiSi film 12, a Ti film 30 and a TiN film 13, to form ohmic contact.

Figure 44:
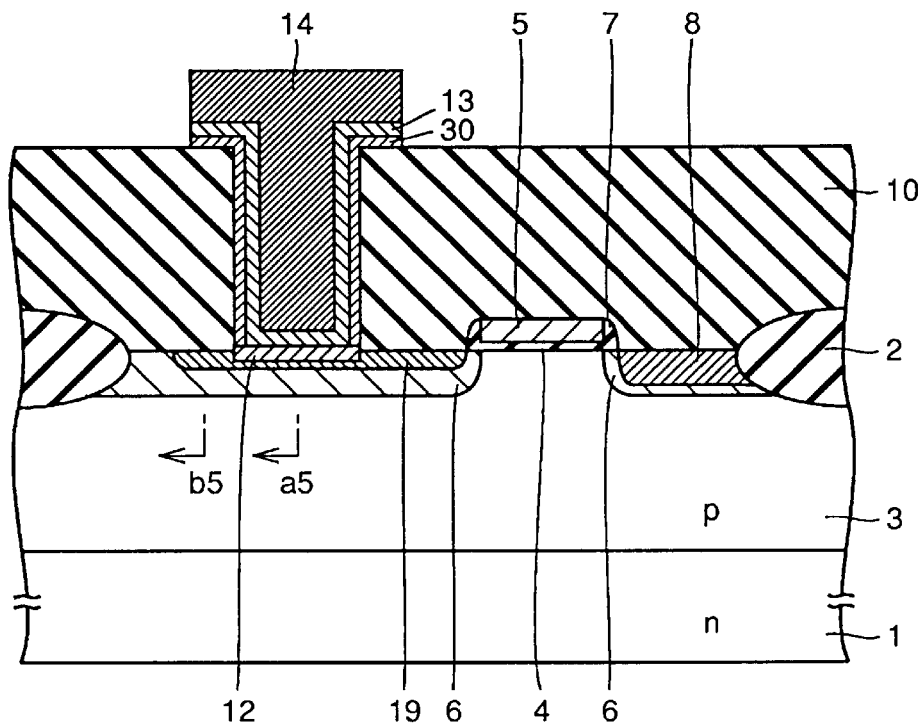
FIG. 44 is a sectional view showing the structure of an SRAM memory cell according to an embodiment 5 of the present invention.
Figure 45:
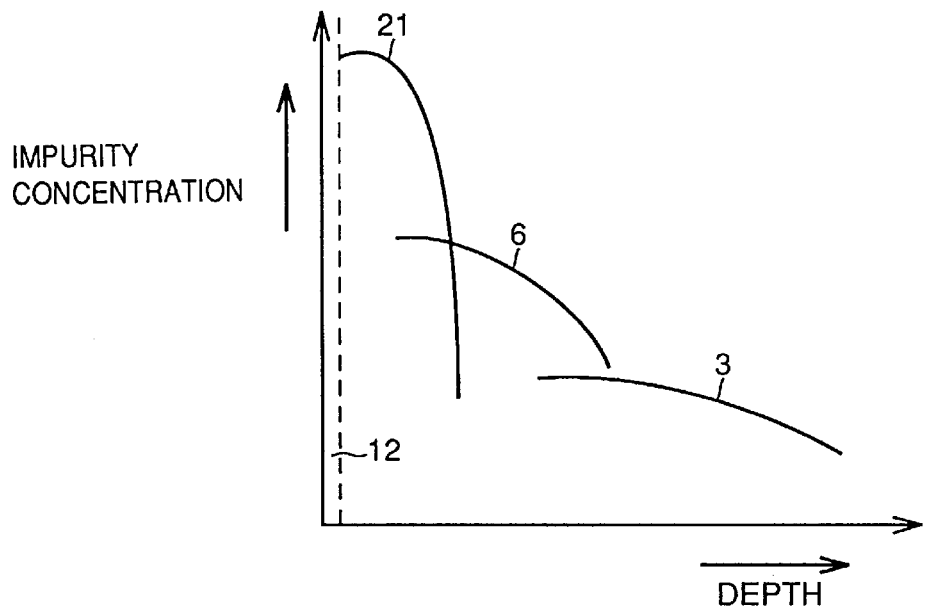
FIG. 45 illustrates an impurity concentration profile along arrow a5 in FIG. 44.
Figure 46:
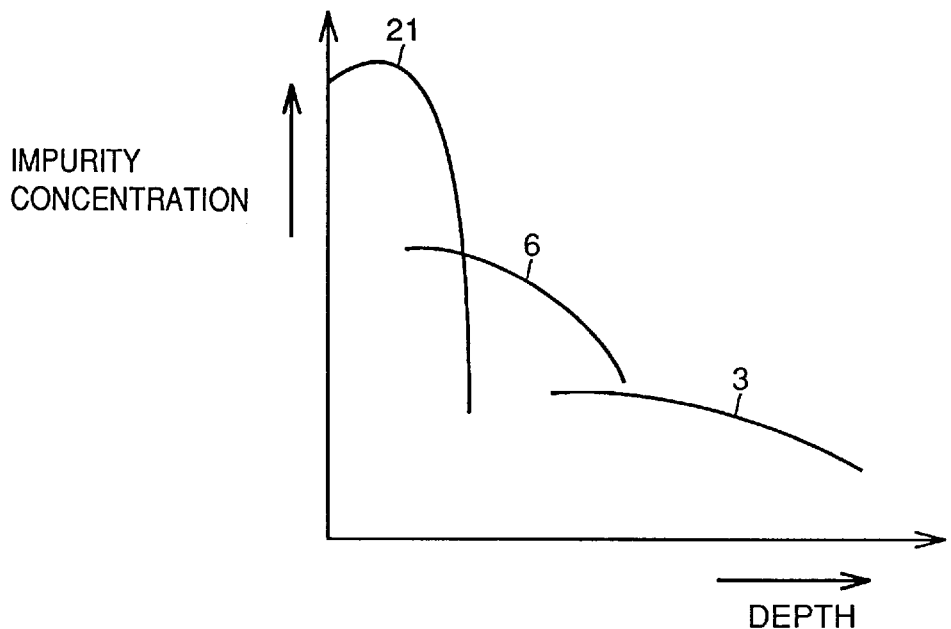
FIG. 46 illustrates an impurity concentration profile along arrow b5 in FIG. 44.

FIGS. 45 and 46 illustrate impurity concentration profiles along arrows a5 and b5 in FIG. 44 respectively.

A method of fabricating the semiconductor device having the aforementioned structure is now described with reference to FIGS. 47 to 52.

Figure 47:
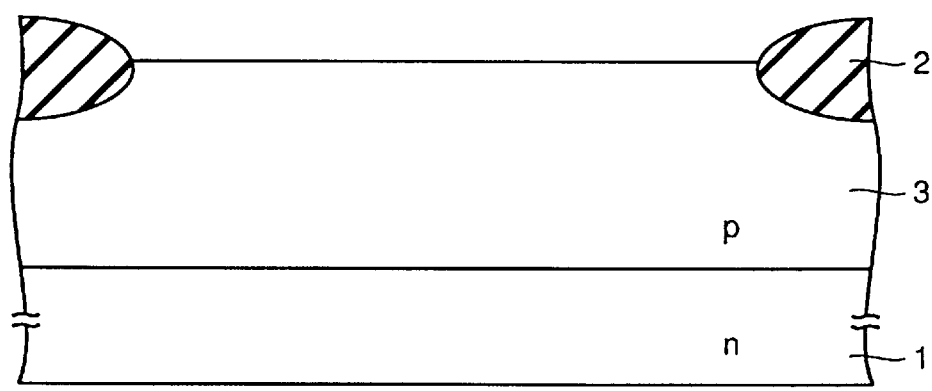
FIGS. 47 to 52 are sectional views showing first to sixth steps of a method of fabricating the SRAM cell shown in FIG. 44 respectively.

Referring to FIG. 47, a p-type impurity such as BF$_2$ or B is introduced up to a position of a prescribed depth from the major surface of the n-type semiconductor substrate 1, for forming the p-type well and collector region 3 having the impurity concentration of $1 \times 10^{16}$ to $5 \times 10^{17}$ cm$^{-3}$. Thereafter the isolation oxide films 2 are formed by the LOCOS method or the like, for defining the active region on the major surface of the n-type semiconductor substrate 1.

Figure 48:
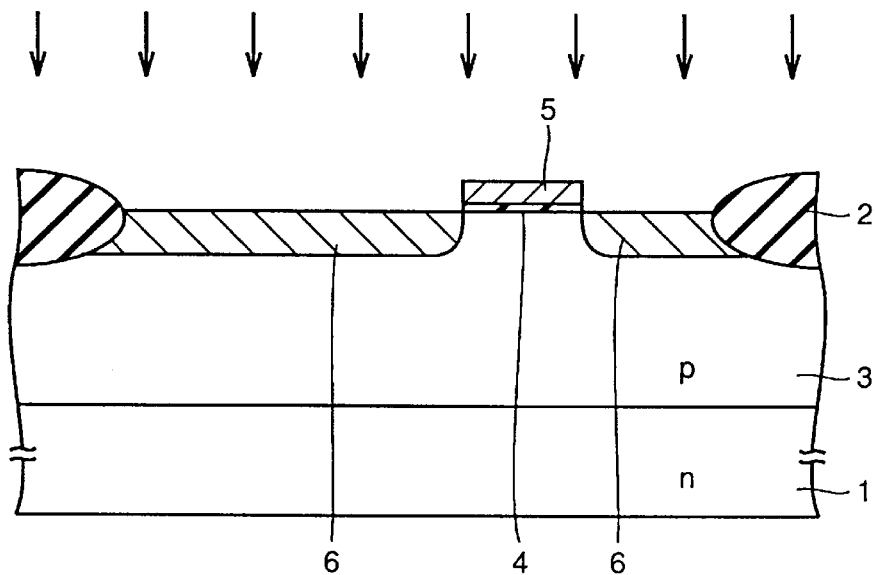

Referring to FIG. 48, the gate electrode 5 is formed on the major surface of the n-type semiconductor substrate 1 through the gate oxide film 4, and thereafter an n-type impurity such as P or As is introduced through the gate electrode 5 and the isolation oxide films 2 serving as masks in conditions of an injection rate of $1 \times 10^{13}$ to $1 \times 10^{14}$ cm$^{-2}$ and injection energy of 30 to 100 keV, for forming the n-type source/drain regions/base region 6 having the impurity concentration of $5 \times 10^{17}$ to $5 \times 10^{19}$ cm$^{-3}$.

Figure 49:
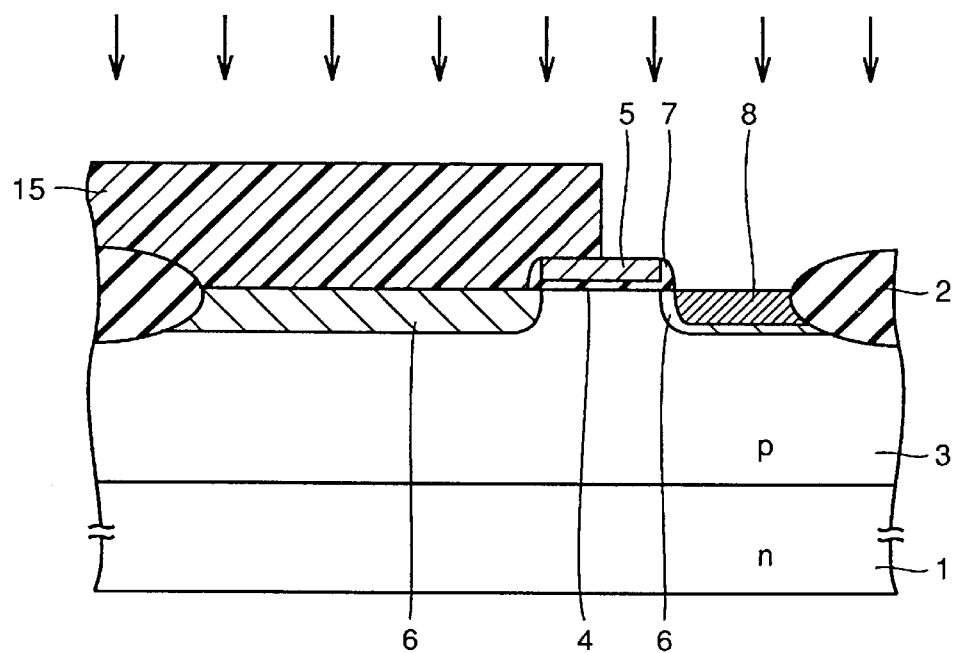

Referring to FIG. 49, the side wall oxide films 7 are formed on the side wall portions of the gate electrode 5, the base region 6 is covered with a resist film 15, and an n-type impurity such as As is introduced into the remaining source/drain region 6 in conditions of an injection rate of $1 \times 10^{15}$ to $5 \times 10^{15}$ cm$^{-2}$ and injection energy of 10 to 60 keV, for forming the n-type source/drain region 8 having the impurity concentration of $1 \times 10^{20}$ to $1 \times 10^{22}$ cm$^{-3}$.

Figure 50:
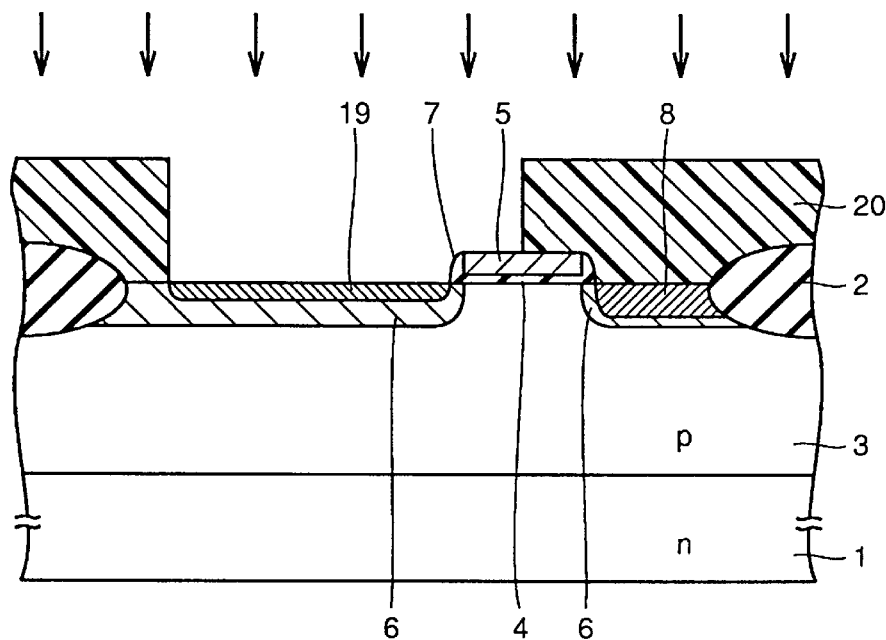

Referring to FIG. 50, the resist film 15 is removed, the source/drain regions 6 and 8 are covered with other resist films 20, and thereafter a p-type impurity such as BF$_2$ or B is introduced into the base region 6 through the resist films 20, the gate electrode 5, the side wall oxide films 7 and the isolation oxide films 2 serving as masks in conditions of an injection rate of $1 \times 10^{14}$ to $5 \times 10^{15}$ cm$^{-2}$ and injection energy of 5 to 30 keV, for forming the p-type emitter region 19 having the impurity concentration of $5 \times 10^{19}$ to $1 \times 10^{22}$ cm$^{-3}$.

At this time, the resist films 20 are formed to cover an edge portion of one of the isolation oxide films 2 on the base region 20. Thus, no p-type impurity is introduced into the edge portion of this isolation oxide film 2, whereby the p-type emitter region 19 can be implemented in a shape not in contact with the edge portion of this isolation oxide film 2.

Figure 51:
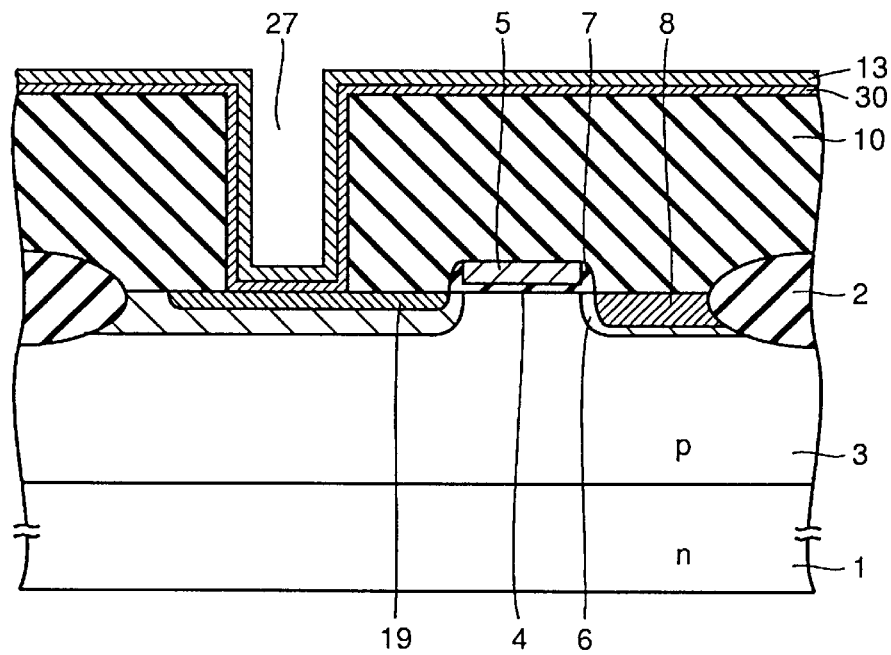

Referring to FIG. 51, the resist films 20 are removed, the interlayer isolation film 10 is formed on the n-type semiconductor substrate 1, and a contact hole 27 is formed to partially expose the n-type base region 6. Thereafter the Ti film 30 of 100 to 500 Å and the TiN film 13 of 500 to 2000 Å are formed by sputtering.

Figure 52:
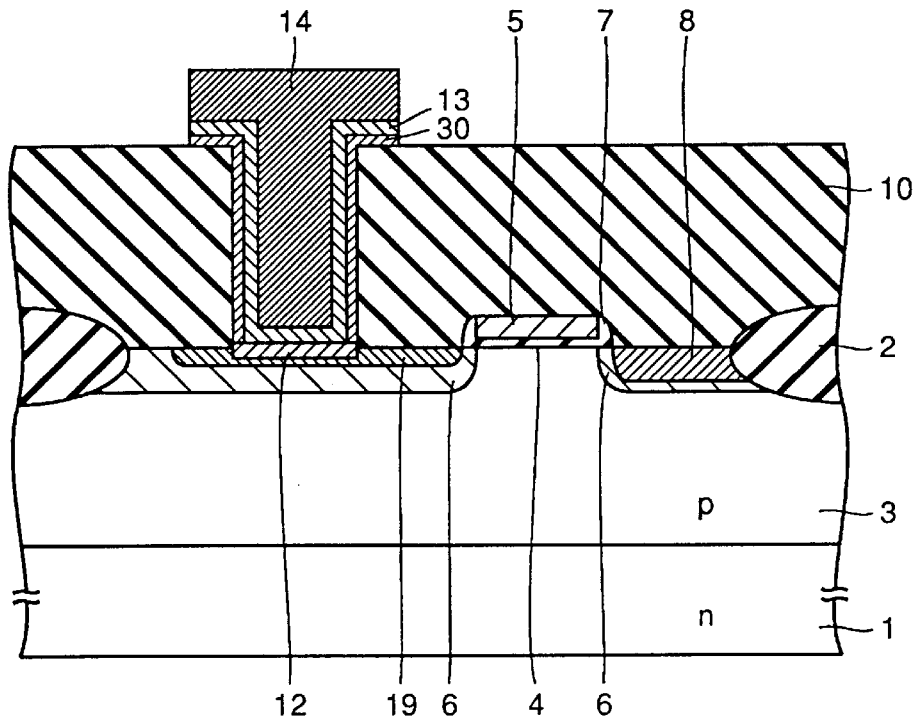

Then, heat treatment is performed for forming the TiSi film 12 on the interface between the p-type emitter region 19 and the Ti film 30, as shown in FIG. 52. Thereafter the wiring layer 14 consisting of a metal such as Al is deposited in the contact hole 27, and the wiring layer 14, the TiN film 13 and the Ti film 30 are patterned. Thus, the semiconductor device shown in FIG. 44 is completed.

In the semiconductor device and the method of fabricating the same according to this embodiment, punch-through can be prevented between the p-type emitter region 19 and one of the isolation oxide films 2 in addition to the function/effect attained by the aforementioned semiconductor device according to the embodiment 4, whereby the operability of an SRAM memory cell can be further improved.

Embodiment 6

Each of the semiconductor devices according to the embodiments 2 and 3 is provided with the p-type first impurity layer 9a or 17a for increasing the p-type impurity concentration in the vicinity of the surface of the n-type semiconductor substrate 1, in order to attain an excellent ohmic junction of emitter contact. In this case, the base region 6 is formed when the impurity is injected for forming the source/drain regions 6 and the p-type second impurity layer 9b or 17b is formed after the contact hole is defined. Thus, the injection depth of the impurity for the p-type second impurity layer 9b or 17b is dispersed with respect to the base region 6, leading to non-uniform characteristics of the bipolar transistor. Accordingly, a semiconductor device according to an embodiment 6 of the present invention is adapted to reduce such dispersion of the characteristics of the bipolar transistor.

The semiconductor device according to this embodiment is now described with reference to FIG. 53.

A p-type well and collector region 3 having an impurity concentration of $1 \times 10^{16}$ to $5 \times 10^{17}$ cm$^{-3}$ is formed up to a position of a prescribed depth from a major surface of an n-type semiconductor substrate 1 consisting of silicon or the like, and isolation oxide films 2 for defining an active region are formed on the major surface of the n-type semiconductor substrate 1.

In the active region, a gate electrode 5 is formed on the major surface of the n-type semiconductor substrate 1 through a gate oxide film 4, and side wall oxide films 9 are formed on side wall portions of the gate electrode 5.

The p-type well and collector region 3 is provided with n-type source/drain regions 6 and 8 having impurity concentrations of $5 \times 10^{17}$ to $5 \times 10^{19}$ cm$^{-3}$ and $1 \times 10^{20}$ to $1 \times 10^{22}$ cm$^{-3}$ respectively are formed to hold the gate electrode 5 therebetween.

One of the source/drain regions 6 serves also as a base region 6 of a bipolar transistor, and a p-type first impurity layer 9a having an impurity concentration of $5 \times 10^{17}$ to $1 \times 10^{20}$ cm$^{-3}$ is formed in this base region 6. A p-type second impurity layer 9b having an impurity concentration of $5 \times 10^{19}$ to $1 \times 10^{21}$ cm$^{-3}$ is formed in the first impurity layer 9a to be enclosed with this p-type first impurity layer 9a, and the p-type first and second impurity layers 9a and 9b form an emitter region 9 of the bipolar transistor.

Further, the semiconductor device according to this embodiment is provided with an n-type intrinsic base region 25 extending from the lower surface of the p-type second impurity layer 9b to the collector region 3. In addition, an interlayer isolation film 10 having a contact hole reaching the p-type second impurity layer 9b is formed on the surface of the n-type semiconductor substrate 1.

The p-type second impurity layer 9b is connected with a wiring layer 14 consisting of a metal such as Al through the contact hole with interposition of a TiSi film 12, a Ti film 30 and a TiN film 13.

Figure 53:
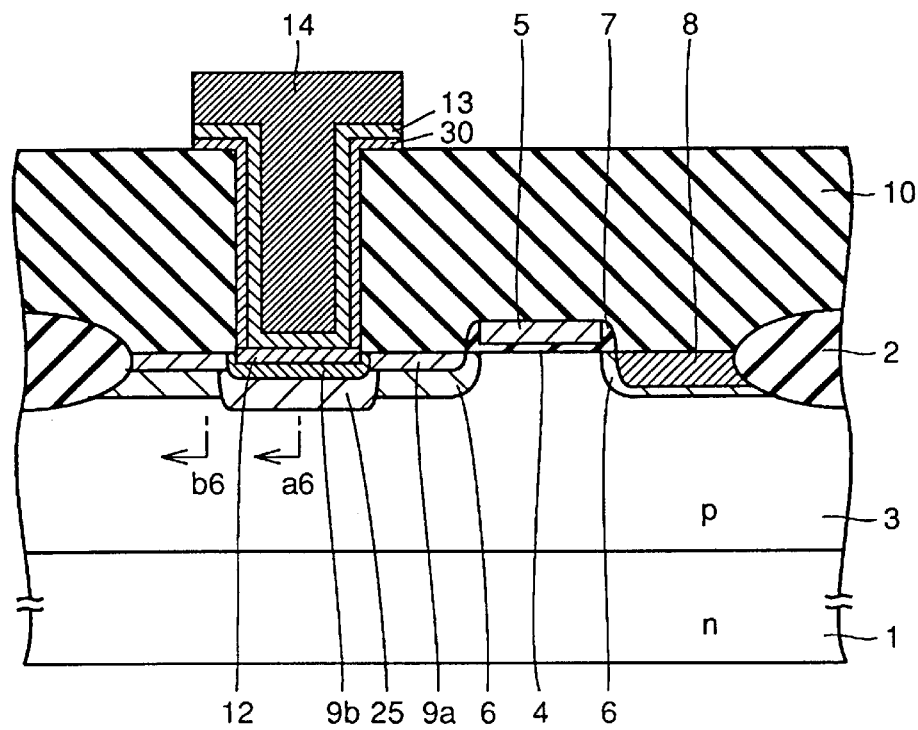
FIG. 53 is a sectional view showing the structure of an SRAM cell according to an embodiment 6 of the present invention.
Figure 54:
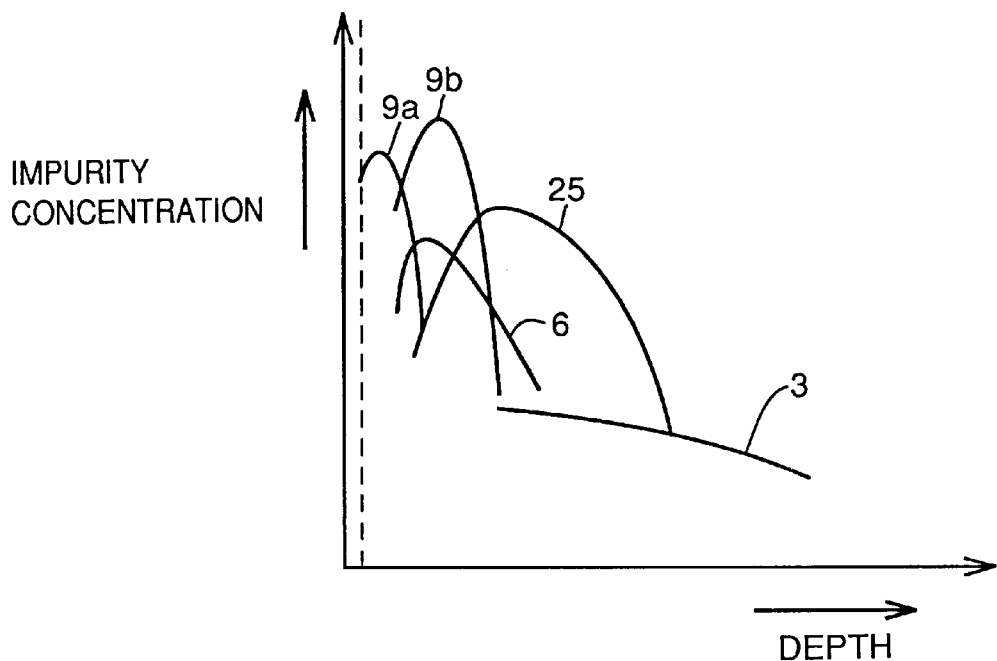
FIG. 54 illustrates an impurity concentration profile along arrow a6 in FIG. 53.
Figure 55:
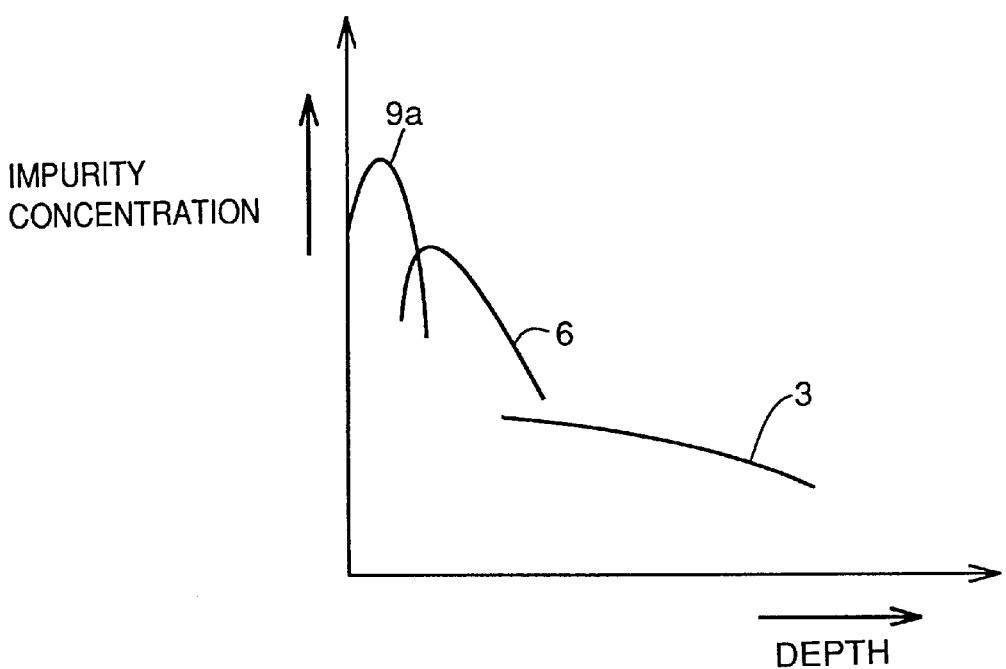
FIG. 55 illustrates an impurity concentration profile along arrow b6 in FIG. 53.

FIGS. 54 and 55 illustrate impurity concentration profiles along arrows a6 and b6 in FIG. 53 respectively.

As shown in FIG. 54, the impurity concentrations of the respective regions are so set that no impurity is present on a surface part of the first impurity layer 9a converted to TiSi, the impurity concentration of the second impurity layer 9b is higher than that of the first impurity layer 9a, and the impurity concentration of the intrinsic base region 25 is higher than that of the base region 6.

Thus, the intrinsic base region 25 is formed in formation of the emitter region 9 for suppressing dispersion of the bipolar transistor characteristics, whereby the operability of an SRAM memory cell can be improved.

A method of fabricating the semiconductor device shown in FIG. 53 is now described with reference to FIGS. 56 to 62.

Figure 56:
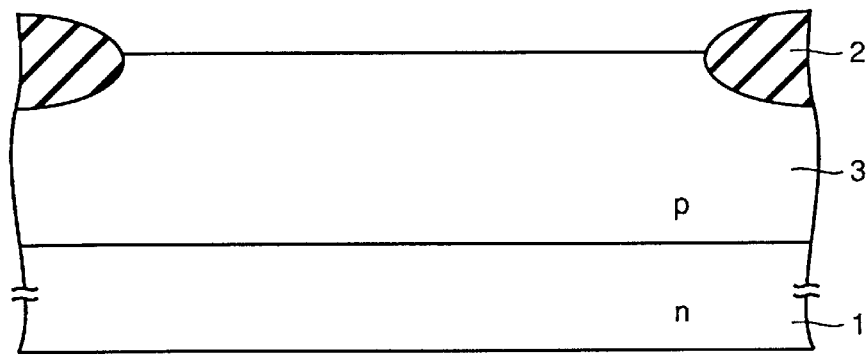
FIGS. 56 to 62 are sectional views showing first to seventh steps of a method of fabricating the SRAM memory cell shown in FIG. 53 respectively.

Referring to FIG. 56, a p-type impurity such as BF$_2$ or B is introduced up to a position of a prescribed depth from the major surface of the n-type semiconductor substrate 1, for forming the p-type well and collector region 3 having the impurity concentration of $1 \times 10^{16}$ to $5 \times 10^{17}$ cm$^{-3}$. Thereafter the isolation oxide films 2 are formed by the LOCOS method or the like, for defining the active region on the major surface of the n-type semiconductor substrate 1.

Figure 57:
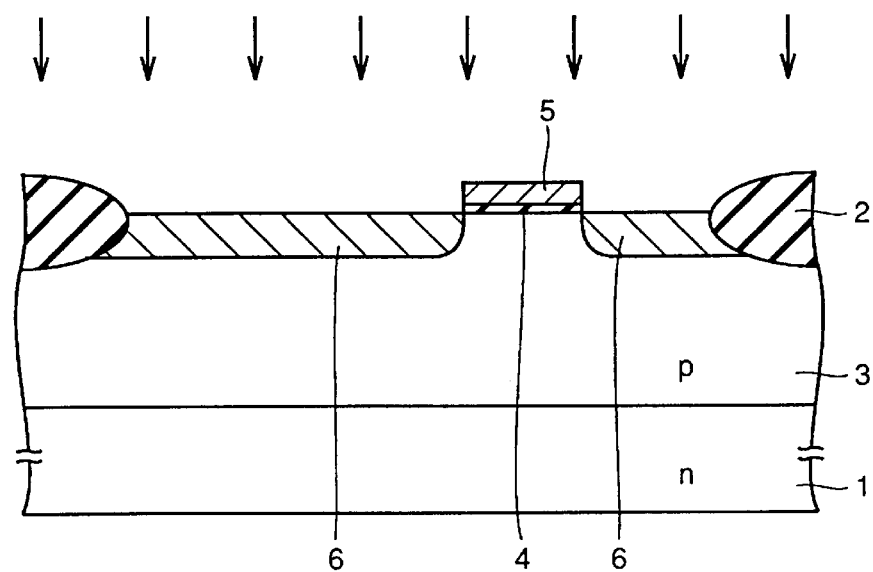

Referring to FIG. 57, the gate electrode 5 is formed on the major surface of the n-type semiconductor substrate 1 through the gate oxide film 4, and an n-type impurity such as P or As is introduced through the gate electrode 5 and the isolation oxide films 2 serving as masks in conditions of an injection rate of $1 \times 10^{13}$ to $1 \times 10^{14}$ cm$^{-2}$ and injection energy of 30 to 100 keV, for forming the n-type source/drain regions/base region 6 having the impurity concentration of $5 \times 10^{17}$ to $5 \times 10^{19}$ cm$^{-3}$.

Figure 58:
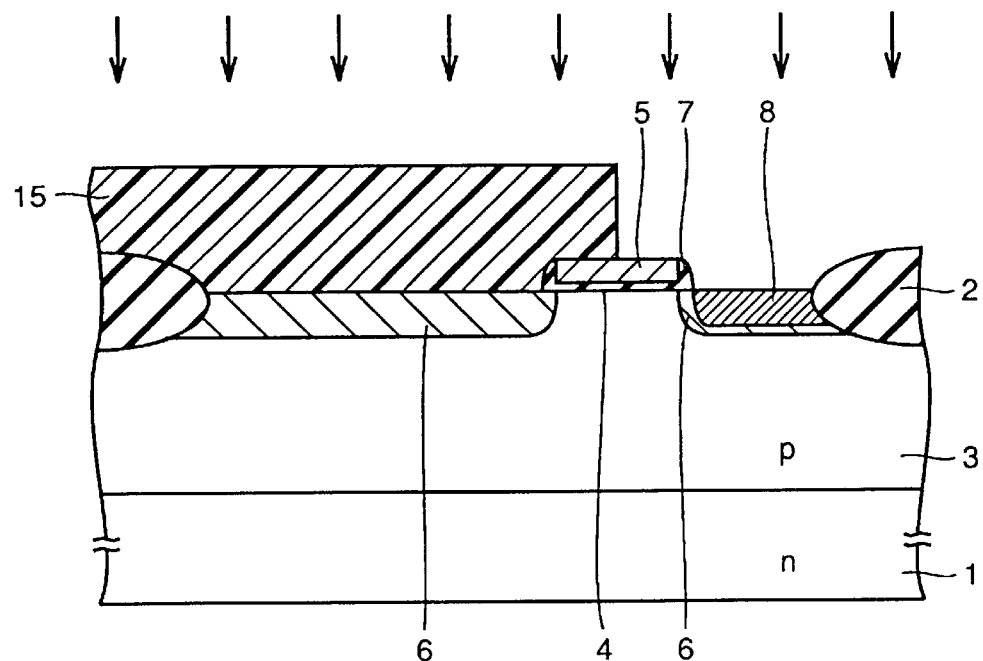

Referring to FIG. 58, the side wall oxide films 7 are formed on the side wall portions of the gate electrode 5, the base region 6 is covered with a resist film 15, and thereafter an n-type impurity such as As is introduced into the remaining source/drain region 6 in conditions of an injection rate of $1 \times 10^{15}$ to $5 \times 10^{15}$ cm$^{-2}$ and injection energy of 10 to 60 keV, for forming the n-type source/drain region 8 having the impurity concentration of $1 \times 10^{20}$ to $1 \times 10^{22}$ cm$^{-3}$.

Figure 59:
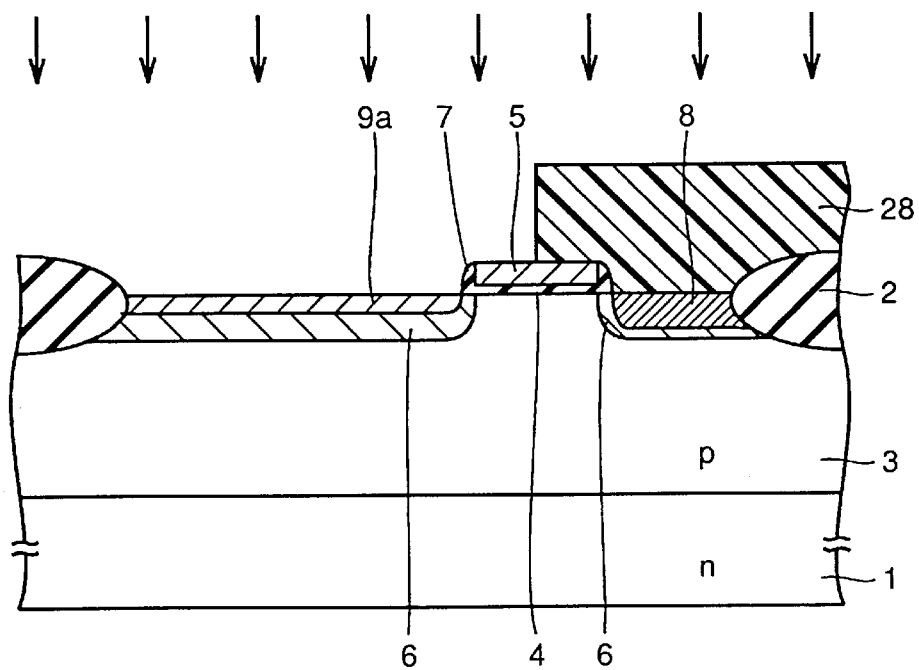

Referring to FIG. 59, the resist film 15 is removed, the source/drain regions 6 and 8 are covered with another resist film 28, and thereafter a p-type impurity such as BF$_2$ or B is introduced into the base region 6 in a self-alignment manner through the resist film 28, the gate electrode 5, the side wall oxide films 7 and the isolation oxide films 2 serving as masks in conditions of an injection rate of $1 \times 10^{13}$ to $5 \times 10^{14}$ cm$^{-2}$ and injection energy of 5 to 30 keV, for forming the p-type first impurity layer 9a having the impurity concentration of $5 \times 10^{17}$ to $1 \times 10^{20}$ cm$^{-3}$.

Figure 60:
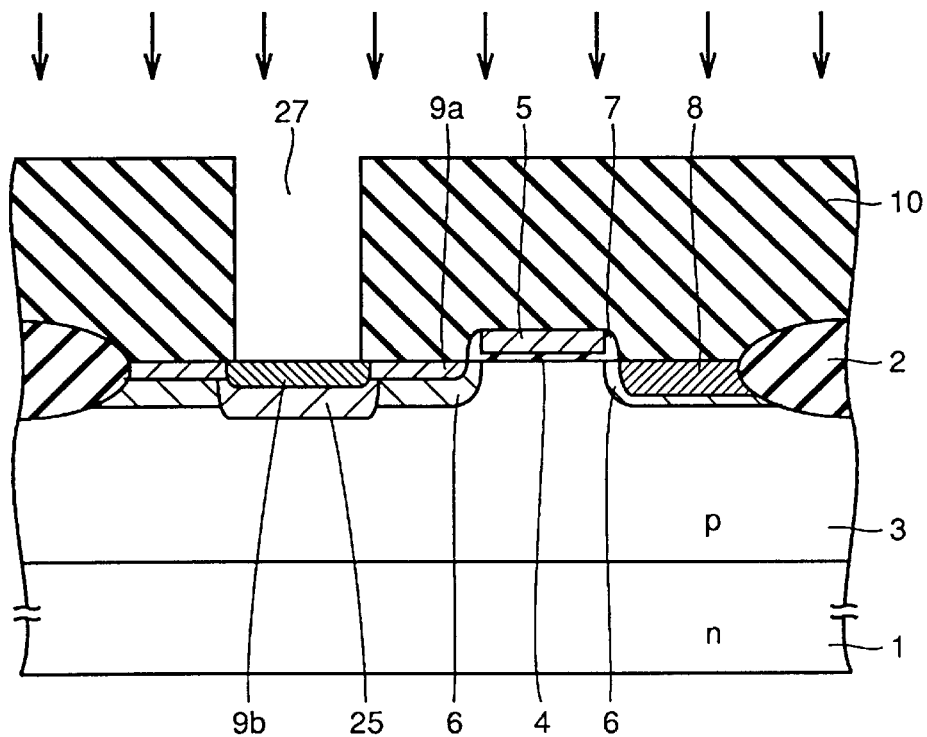

Referring to FIG. 60, the resist film 28 is removed, the interlayer isolation film 10 is formed on the n-type semiconductor substrate 1, and thereafter a contact hole 27 is formed to partially expose the n-type base region 6. Thereafter a p-type impurity such as BF$_2$ or B is introduced in conditions of an injection rate of $5 \times 10^{14}$ to $1 \times 10^{15}$ cm$^{-2}$ and injection energy of 20 to 100 keV, for forming the p-type second impurity layer 9b having the impurity concentration of $5 \times 10^{19}$ to $1 \times 10^{21}$ cm$^{-3}$.

Further, an n-type impurity such as P or As is introduced through the interlayer isolation film 10 serving as a mask in conditions of an injection rate of $1 \times 10^{13}$ to $1 \times 10^{14}$ cm$^{-2}$ and injection energy of 40 keV to 100 keV, for forming the intrinsic base region 25 having the impurity concentration of $5 \times 10^{17}$ to $1 \times 10^{19}$ cm$^{-3}$.

Figure 61:
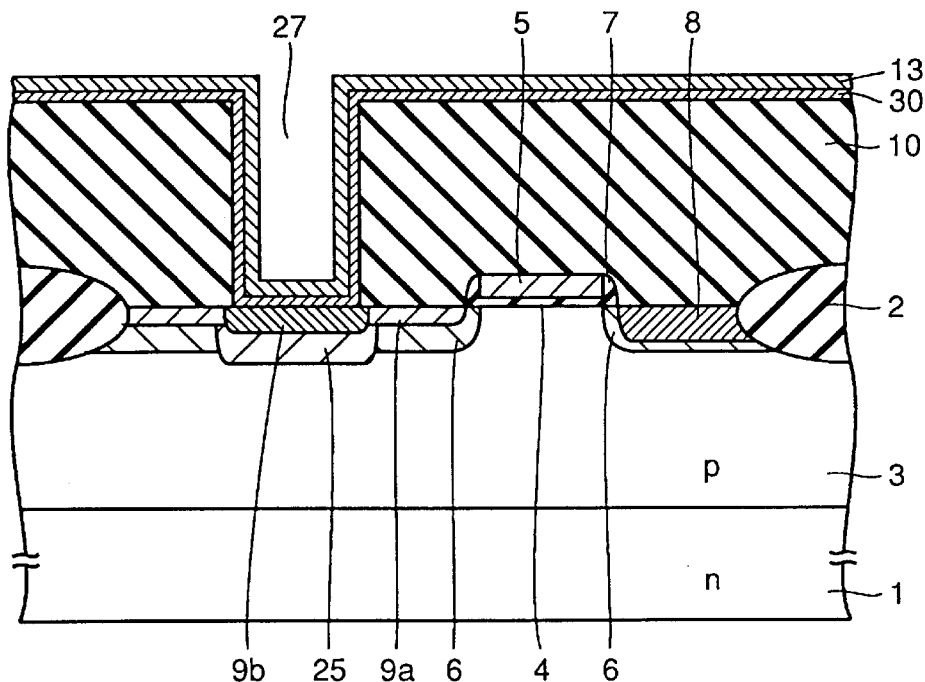
Figure 62:
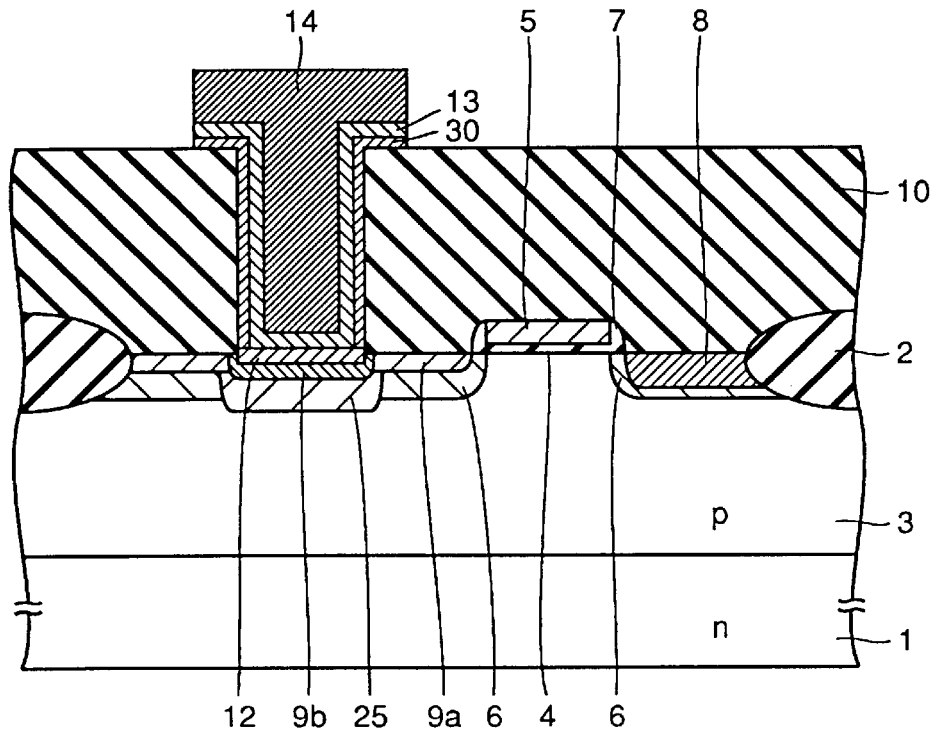

Referring to FIG. 61, the Ti film 30 of 100 to 500 Å and the TiN film 13 of 500 to 2000 Å are formed by sputtering. Thereafter heat treatment is performed, for forming the TiSi film 12 on the interface between the p-type second impurity layer 9b and the Ti film 30, as shown in FIG. 62. Thereafter the wiring layer 14 consisting of a metal such as Al is deposited in the contact hole 27, and the wiring layer 14, the TiN film 13 and the Ti film 30 are patterned. Thus, the semiconductor device shown in FIG. 53 is completed.

In the semiconductor device and the method of fabricating the same according to the embodiment 6, the functions/effects attained in the embodiments 2 and 3 can be attained, dispersion of the bipolar transistor characteristics can be reduced by providing the intrinsic base region 25 under the p-type second impurity layer 9b, and the operability of an SRAM memory cell can be improved.

Figure 63:
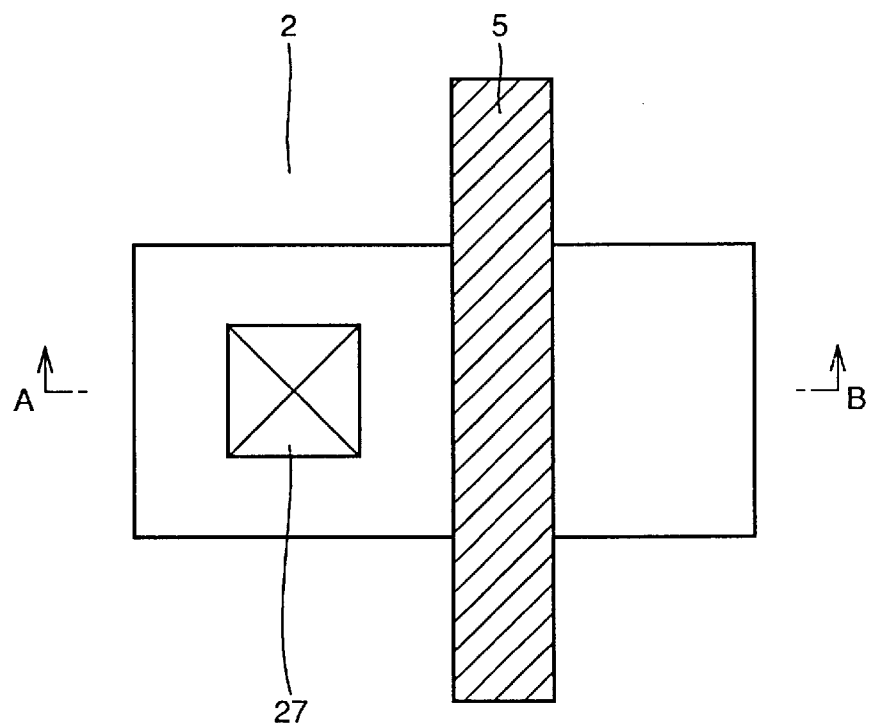
FIG. 63 illustrates the plane structure of any of the SRAM memory cells according to the embodiments 1 to 6.
Figure 64:
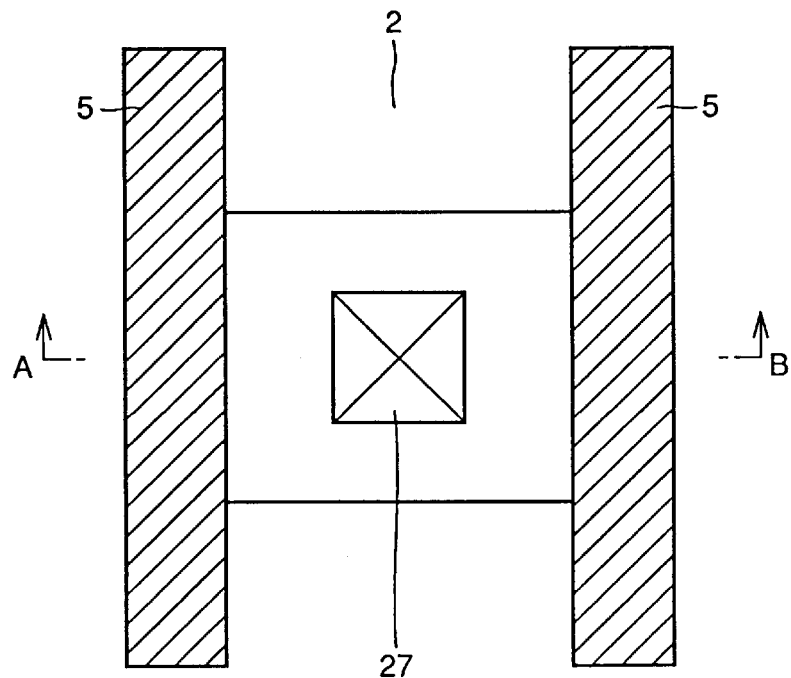
FIG. 64 illustrates the plane structure of an SRAM memory cell according to a further embodiment of the present invention.
Figure 65:
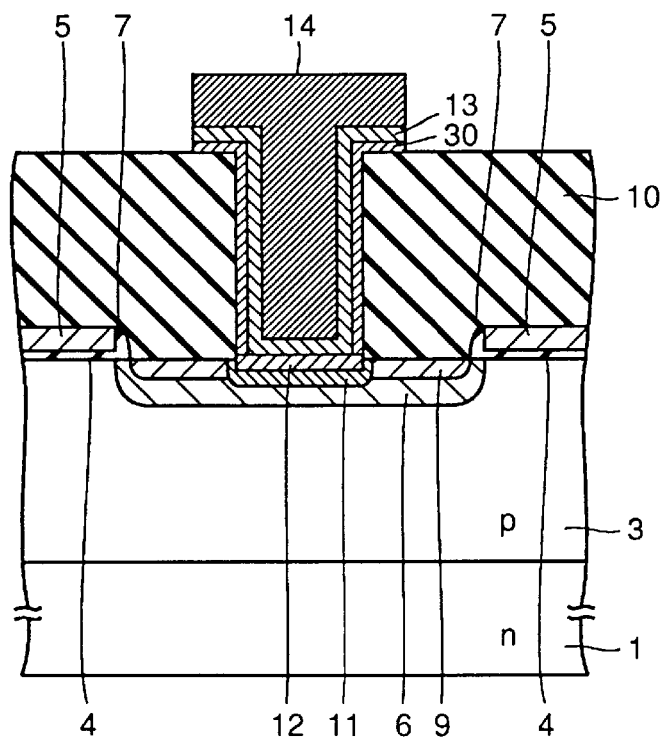
FIG. 65 is a sectional view taken along the line A–B in FIG. 64.
Figure 66:
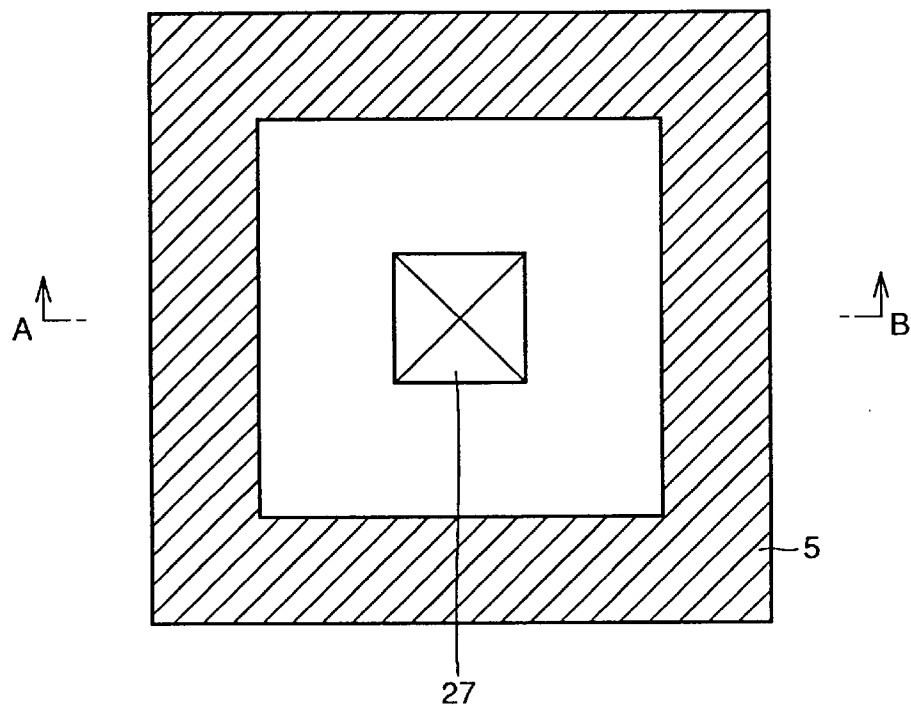
FIG. 66 illustrates the plane structure of an SRAM memory cell according to a further embodiment of the present invention.
Figure 67:
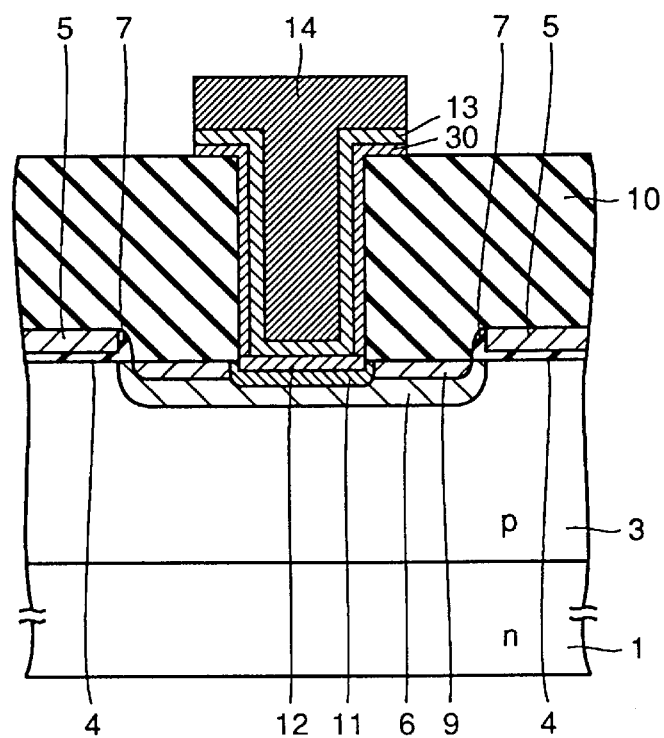
FIG. 67 is a sectional view taken along the line A–B in FIG. 66.
Figure 68:
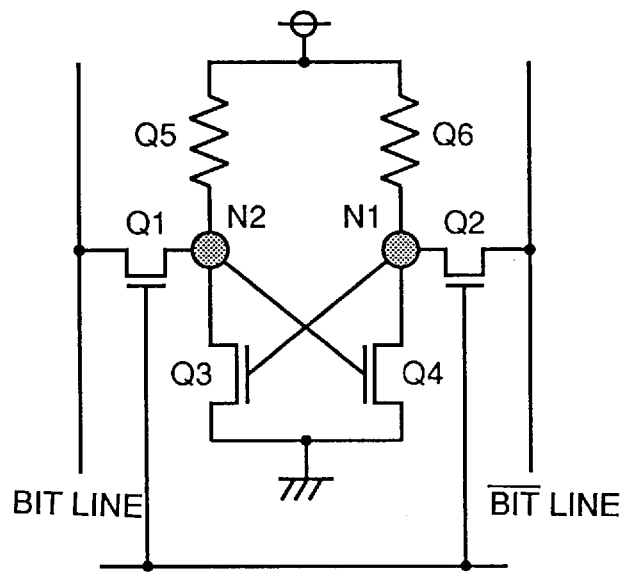
FIG. 68 is a circuit diagram of a conventional SRAM memory cell.
Figure 69:
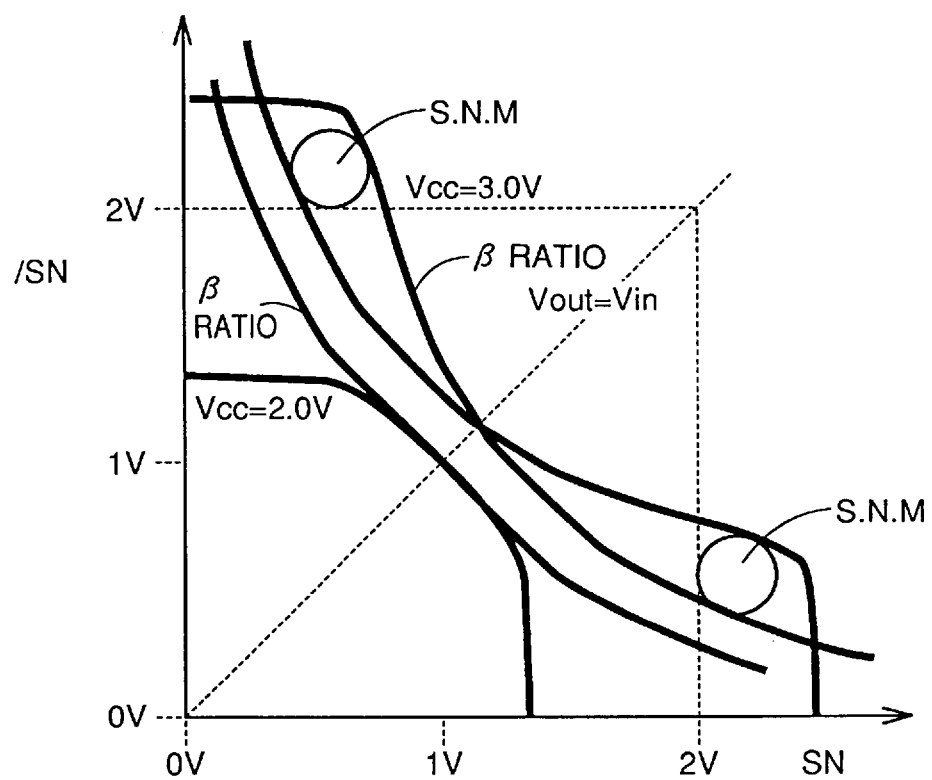
FIG. 69 is adapted to illustrate problems of the conventional SRAM memory cell shown in FIG. 68.

While each of the embodiments 1 to 6 has been described on the plane shape having the single contact hole 27 provided on a side of the gate electrode 5 with reference to the sectional structure as viewed along the line A–B in FIG. 63, the present invention is not restricted to this structure but is also applicable to such a structure that gate electrodes 5 are arranged on both sides of a contact hole 27 as shown in FIGS. 64 and 65 as a plan view and a sectional view respectively. Further, the present invention can attain functions/effects similar to the above in such a structure that a gate electrode 5 encloses a contact hole 27 as shown in FIGS. 66 and 67 as a plan view and a sectional view respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a first conductivity type semiconductor substrate;

a second conductivity type collector region formed up to a position of a first depth from a major surface of said semiconductor substrate;

a first conductivity type base region formed up to a position of a second depth, being smaller than said first depth, from said major surface of said semiconductor substrate; and an emitter region provided with a first impurity layer having a second conductivity type impurity concentration peak on a position of a third depth, being smaller than said second depth, from said major surface of said semiconductor substrate and a second impurity layer having a second conductivity type impurity concentration peak on a position between said second and third depths and being formed to be enclosed with said first impurity layer, wherein said base region is formed by a source/drain region of a MOS transistor.

2. The semiconductor device in accordance with claim 1, wherein said first impurity layer is formed on a part of said major surface of said semiconductor substrate enclosed with an element isolation film and a gate electrode forming said MOS transistor.

3. The semiconductor device in accordance with claim 2, wherein said first impurity layer is formed not to be in contact with said element isolation film.

4. A semiconductor device comprising:

a first conductivity type semiconductor substrate;

a second conductivity type collector region formed up to a position of a first depth from a major surface of said semiconductor substrate;

a first conductivity type base region formed up to a position of a second depth, being smaller than said first depth, from said major surface of said semiconductor substrate; and an emitter region provided with a first impurity layer having a second conductivity type impurity concentration peak on a position of a third depth, being smaller than said second depth, from said major surface of said semiconductor substrate and a second impurity layer having a second conductivity type impurity concentration peak on a position between said second and third depths and being formed to be enclosed with said first impurity layer, further comprising a first conductivity type intrinsic base region being in contact with said second impurity layer and so formed as to extend in the depth direction for reaching said collector region.

* * * * *